(12) United States Patent
Jeon et al.

(10) Patent No.: US 12,532,457 B2
(45) Date of Patent: Jan. 20, 2026

(54) SEMICONDUCTOR MEMORY DEVICE AND METHOD OF MANUFACTURING THE SAME

(71) Applicant: SAMSUNG ELECTRONICS CO., LTD., Suwon-si (KR)

(72) Inventors: Hwanchul Jeon, Seoul (KR); Yeonsu Kim, Daejeon (KR); Youngsik Lee, Suwon-si (KR); Hyuk Kim, Seongnam-si (KR); Sangwuk Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 433 days.

(21) Appl. No.: 18/118,766

(22) Filed: Mar. 8, 2023

(65) Prior Publication Data

US 2023/0301068 A1 Sep. 21, 2023

(30) Foreign Application Priority Data

Mar. 15, 2022 (KR) .................. 10-2022-0032234

(51) Int. Cl.
*H10B 12/00* (2023.01)
*H01L 23/528* (2006.01)

(52) U.S. Cl.
CPC ....... *H10B 12/315* (2023.02); *H01L 23/5283* (2013.01); *H10B 12/05* (2023.02)

(58) Field of Classification Search
CPC .... H01L 23/5283; H10B 12/315; H10B 12/05
See application file for complete search history.

(56) References Cited

U.S. PATENT DOCUMENTS

| 10,748,903 | B2 | 8/2020 | Luan |
| 11,094,699 | B1* | 8/2021 | Brewer ............... H10D 62/121 |
| 2019/0148295 | A1 | 5/2019 | Lee et al. |
| 2020/0403033 | A1* | 12/2020 | Lilak ................. H10B 43/50 |
| 2021/0134800 | A1 | 5/2021 | Park et al. |

(Continued)

FOREIGN PATENT DOCUMENTS

| KR | 10-2021-0022234 A | 3/2021 |
| KR | 10-2021-0051262 A | 5/2021 |
| KR | 10-2021-0086726 A | 7/2021 |

*Primary Examiner* — Steven M Page
(74) *Attorney, Agent, or Firm* — Muir Patent Law, PLLC

(57) ABSTRACT

A semiconductor memory device includes a substrate, contact electrodes extending in a first direction, each of the contact electrodes including a connection portion having a first thickness and a landing portion having a second thickness, an uppermost contact electrode above the contact electrodes, the contact electrodes being longer in the first direction than the uppermost contact electrode and defining a step structure, transistor bodies extending in a second direction and having a first source/drain, a monocrystalline channel layer, and a second source/drain sequentially arranged in the second direction, the monocrystalline channel layer being connected to a corresponding contact electrode, a lower electrode layer connected to the second source/drain of each of the transistor bodies, a capacitor dielectric layer covering the lower electrode layer and having a uniform thickness, and an upper electrode layer separated from the lower electrode layer by the capacitor dielectric layer.

14 Claims, 31 Drawing Sheets

(56) References Cited

U.S. PATENT DOCUMENTS

2021/0159229 A1     5/2021  Gomes et al.
2023/0031207 A1*    2/2023  Son .................... H10D 30/6757
2023/0309289 A1*    9/2023  Choi ...................... H10B 12/03

* cited by examiner

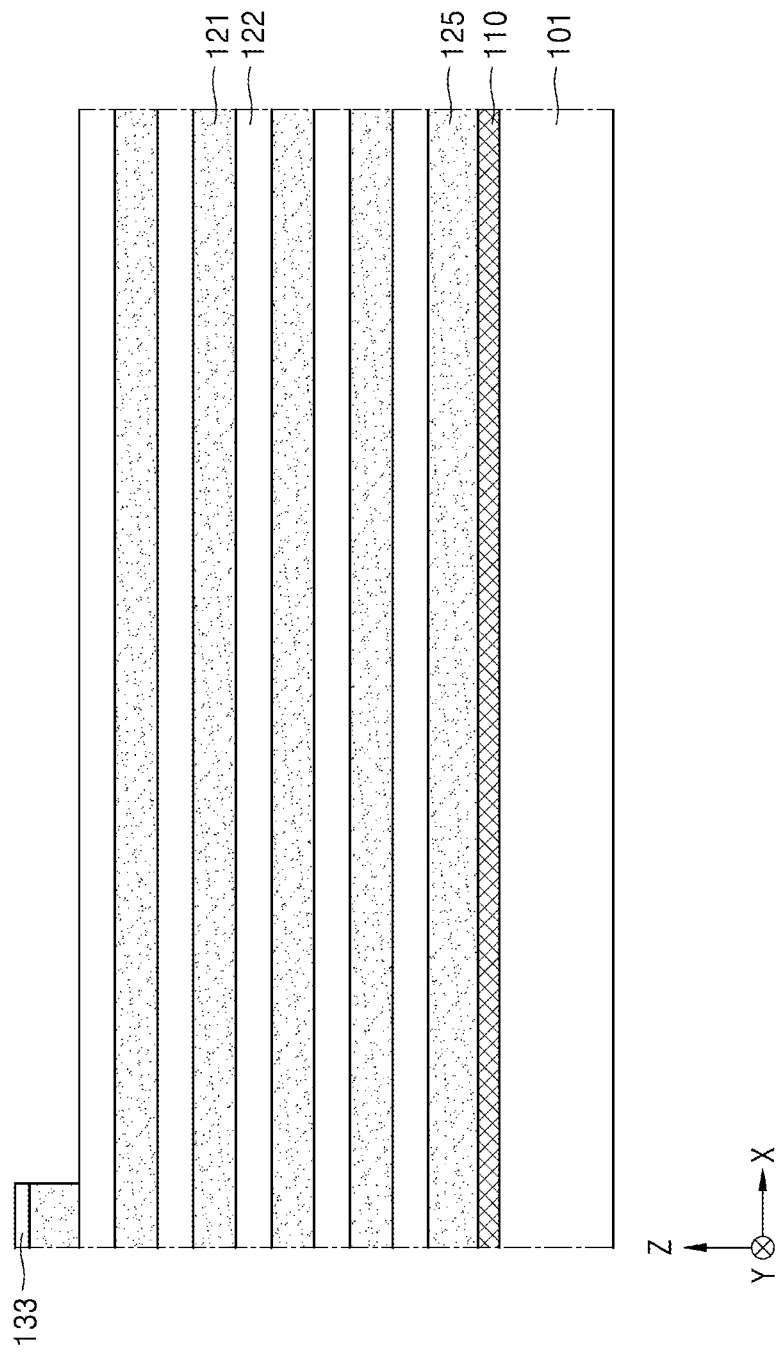

SEMICONDUCTOR MEMORY DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0032234, filed on Mar. 15, 2022, in the Korean Intellectual Property Office, the disclosure of which is incorporated by reference herein in its entirety.

BACKGROUND

1. Field

Embodiments relate to a semiconductor memory device and a method of manufacturing the same, and more particularly, to a three-dimensional (3D) semiconductor memory device.

2. Description of the Related Art

With the demand for compact and multifunctional high-performance of electronic products, high-capacity semiconductor memory devices are required. Because the integration density of two-dimensional (2D) semiconductor memory devices according to the related art mainly depends on a decrease in an area occupied by a memory cell, an increase in the integration density of 2D semiconductor memory devices is restricted by the physical limitations of ultra large-scale integration (VLSI) semiconductor technology. Accordingly, as a solution to the increase in integration density, 3D semiconductor memory devices having memory cells stacked in a vertical direction have received attention.

SUMMARY

According to an aspect of embodiments, there is provided a semiconductor memory device. The semiconductor memory device includes a substrate including a cell array region and a contact region; a plurality of contact electrodes in the contact region, the plurality of contact electrodes extending in a first direction that is parallel with a top surface of the substrate; a plurality of transistor bodies in the cell array region, the plurality of transistor bodies each extending in a second direction that is parallel with the top surface of the substrate and perpendicular to the first direction and including a first source/drain region, a monocrystalline channel layer, and a second source/drain region sequentially arranged in the second direction; a lower electrode layer in the cell array region, the lower electrode layer being connected to the second source/drain region of each of the plurality of transistor bodies; a capacitor dielectric layer in the cell array region, the capacitor dielectric layer covering the lower electrode layer and having a uniform thickness; and an upper electrode layer in the cell array region, the upper electrode layer being separated from the lower electrode layer by the capacitor dielectric layer therebetween, wherein the monocrystalline channel layer of each of the plurality of transistor bodies is connected to a corresponding one of the plurality of contact electrodes, each of the plurality of contact electrodes is longer in the first direction than an upper one of the plurality of contact electrodes and forms a step structure, and each of the plurality of contact electrodes includes a connection portion having a first thickness and a landing portion having a second thickness.

According to another aspect of embodiments, there is provided a semiconductor memory device. The semiconductor memory device includes a substrate including a cell array region and a contact region; a plurality of memory cells in the cell array region, the plurality of memory cells each including a cell transistor and a cell capacitor and being arranged in a third direction that is perpendicular to the substrate; a first step structure in the contact region, the first step structure extending in a first direction that is parallel with a top surface of the substrate; a second step structure in the contact region, the second step structure extending in the first direction and being separated from the first step structure in a second direction that is perpendicular to the first direction and parallel with the top surface of the substrate; and an interlayer insulating layer between the first step structure and the second step structure, wherein each of the first step structure and the second step structure includes a plurality of contact electrodes and an uppermost contact electrode on the plurality of contact electrodes, the plurality of contact electrodes being stacked on the substrate in the third direction, the uppermost contact electrode includes a first connection portion having a first thickness and a first landing portion having a second thickness, each of the plurality of contact electrodes includes a second connection portion having the first thickness and a second landing portion having the second thickness, and a length in the first direction of the first landing portion is different from a length in the first direction of the second landing portion.

According to a further aspect of embodiments, there is provided a method of manufacturing a semiconductor memory device. The method includes forming a plurality of compound semiconductor layers and a plurality of monocrystalline semiconductor layers on a substrate, the plurality of compound semiconductor layers and the plurality of monocrystalline semiconductor layers being alternately stacked on the substrate; forming a plurality of compound semiconductor patterns by etching the plurality of compound semiconductor layers and forming a plurality of monocrystalline semiconductor patterns by etching the plurality of monocrystalline semiconductor layers, the plurality of compound semiconductor patterns extending in a first direction that is parallel with a top surface of the substrate, the plurality of monocrystalline semiconductor patterns extending in the first direction and constituting a first mold and a second mold, the first mold being separated from the second mold in a second direction that is parallel with the top surface of the substrate and perpendicular to the first direction; removing the plurality of compound semiconductor patterns; isotropically etching the plurality of monocrystalline semiconductor patterns; forming an interlayer insulating layer filling between the first mold and the second mold and surrounding the plurality of monocrystalline semiconductor patterns; etching the interlayer insulating layer with a high etch selectivity with respect to the plurality of monocrystalline semiconductor patterns; and etching at least one of the plurality of monocrystalline semiconductor patterns.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
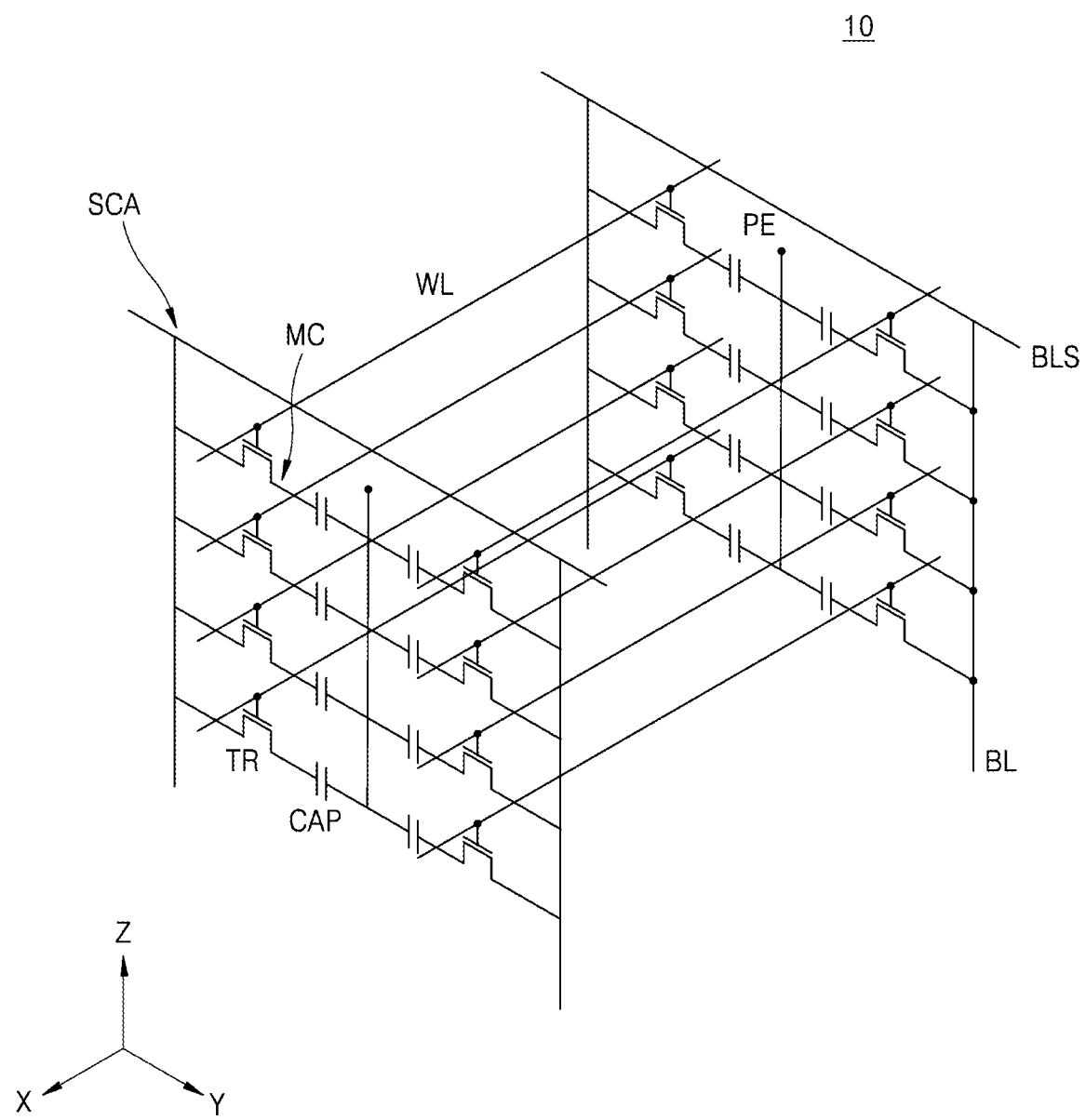
FIG. 1 is an equivalent circuit diagram of a cell array of a semiconductor memory device, according to example embodiments.

FIG. 1 is a circuit diagram of a semiconductor memory device 10, according to example embodiments.

Referring to FIG. 1, the semiconductor memory device 10 may include a plurality of memory cells MC. Each of the memory cells MC may include a cell transistor TR and cell capacitors CAP. The cell transistor TR may be connected to the cell capacitors CAP. For example, one of the source and drain electrodes of the cell transistor TR may be connected to the bottom electrode of each of the cell capacitors CAP.

The memory cells MC may form a plurality of sub cell arrays SCA. According to example embodiments, the sub cell arrays SCA may be arranged in an X direction. The X direction may correspond to the extension direction of word lines WL.

Each of the sub cell arrays SCA may include a plurality of memory cells MC. The memory cells MC of each of the sub cell arrays SCA may be separated from one another in a Y direction and a Z direction.

The Y direction may correspond to the extension direction of bit line straps BLS. The Z direction may correspond to the extension direction of bit lines BL. The Y direction may be substantially perpendicular to the X direction. The Z direction may be substantially perpendicular to the X direction and the Y direction. The X direction may be alternatively referred to as a first direction. The Y direction may be alternatively referred to as a second direction. The Z direction may be alternatively referred to as a third direction.

Among memory cells MC included in one of the sub cell arrays SCA, memory cells MC in the same level in the Z direction may share, e.g., an upper electrode PE of a capacitor CAP, with each other, and may be separated from each other in the Y direction.

The word lines WL may be arranged in the Y direction and the Z direction. The bit lines BL may be arranged in the X direction and the Y direction The bit line straps BLS may be arranged in the X direction.

The bit lines BL may be connected to the bit line straps BLS. Each of the bit line straps BLS may be connected to a plurality of bit lines BL, which are arranged in the Y direction. For example, two bit lines BL connected to one of the sub cell arrays SCA may be connected to a corresponding one of the bit line straps BLS.

The cell capacitors CAP may share the upper electrode PE, which extends in the X direction and the Z direction. In other words, the upper electrode PE may be provided in common to a plurality of cell capacitors CAP, which are arranged in the Z direction and the X direction. For convenience of illustration, the upper electrode PE is shown to extend in the Z direction, and upper electrodes PE shown to be arranged in the X direction correspond to portions of one upper electrode PE.

Figure 2A:
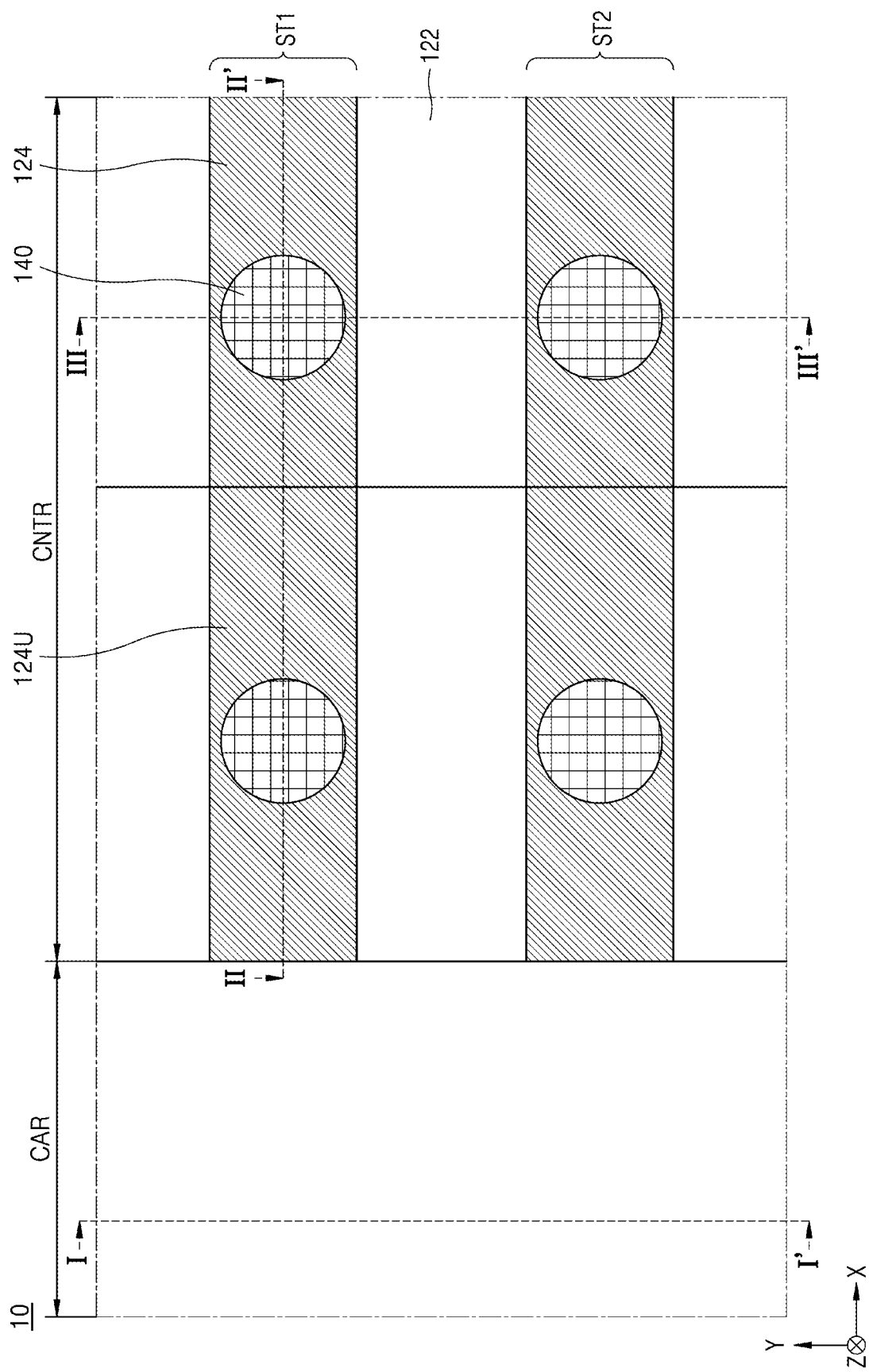
FIG. 2A is a plan view of a semiconductor memory device according to example embodiments.
Figure 2B:
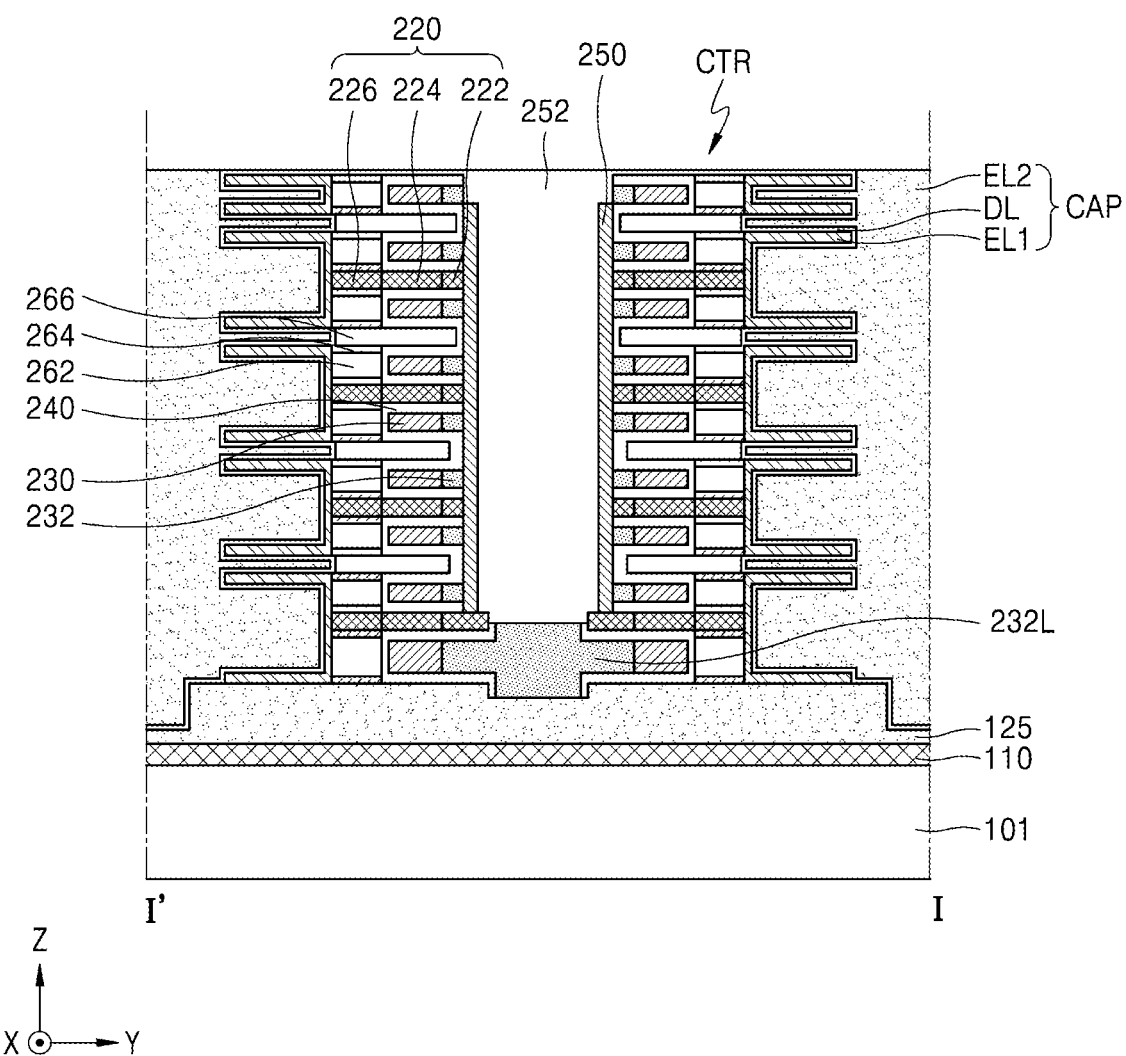
FIG. 2B is a cross-sectional view taken along line I-I' in FIG. 2A.
Figure 2C:
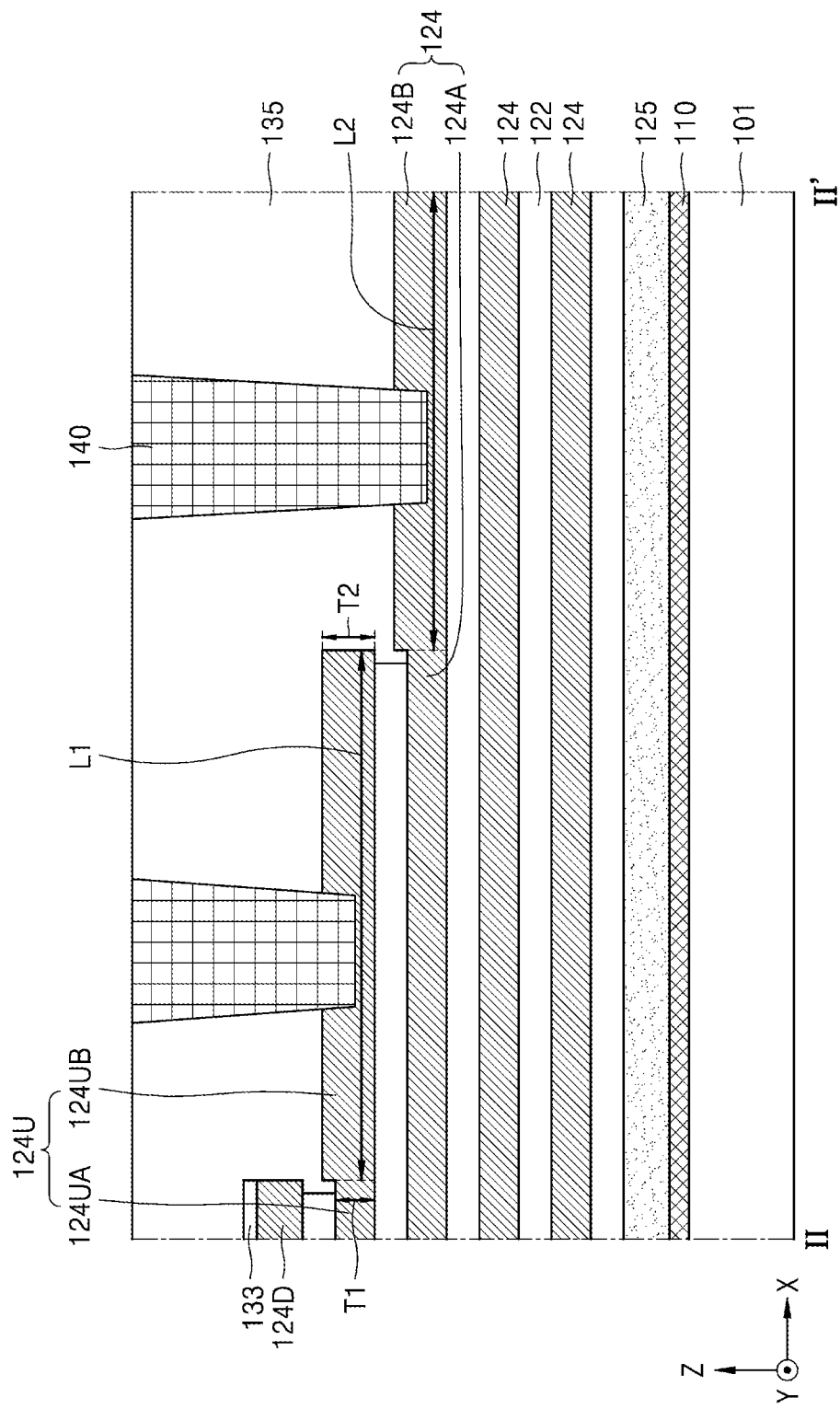
FIG. 2C is a cross-sectional view taken along line II-II' in FIG. 2A.
Figure 2D:
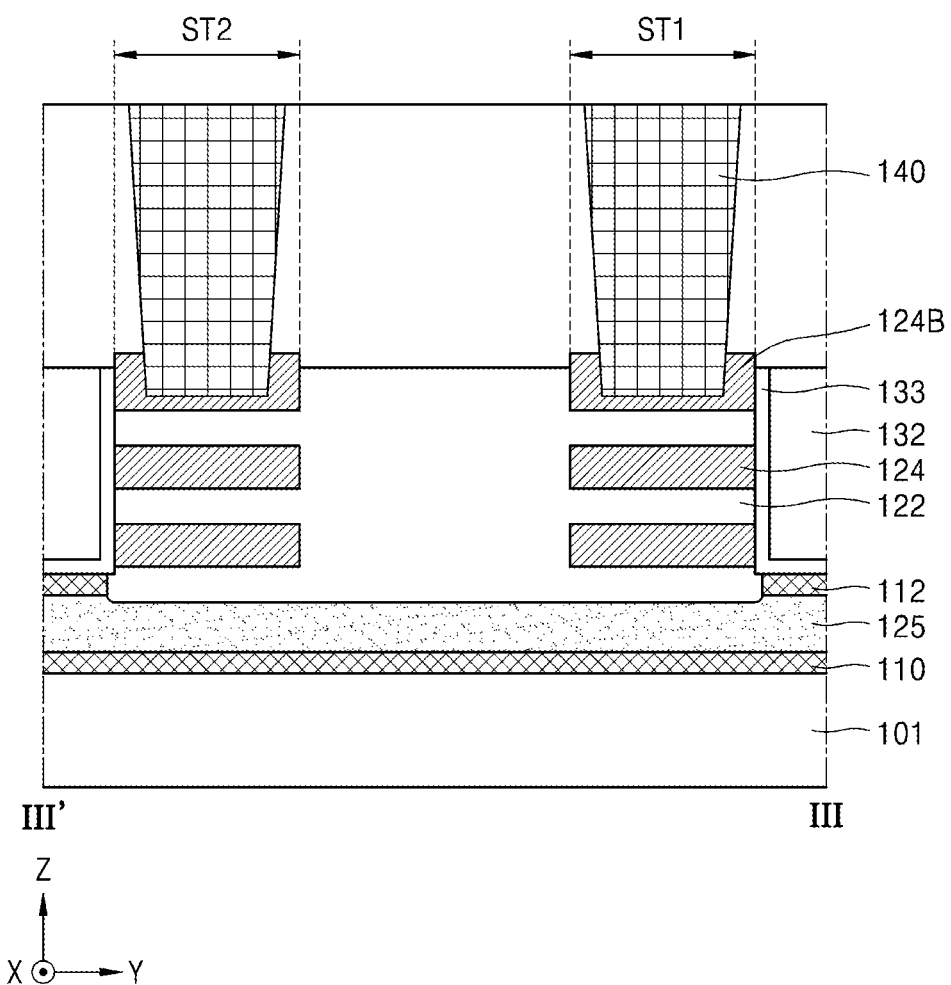
FIG. 2D is a cross-sectional view taken along line in FIG. 2A.

FIG. 2A is a plan view of the semiconductor memory device 10 according to example embodiments. FIG. 2B is a cross-sectional view taken along line I-I' in FIG. 2A. FIG. 2C is a cross-sectional view taken along line II-II' in FIG. 2A. FIG. 2D is a cross-sectional view taken along line in FIG. 2A.

Referring to FIGS. 2A to 2D, the semiconductor memory device 10 may include a substrate 101 and a plurality of cell transistors CTR and cell capacitors CAP on the substrate 101.

The substrate 101 may include, e.g., Si, Ge, or SiGe. For example, the substrate 101 may include a silicon-on-insulator (SOI) substrate or a germanium-on-insulator (GeOI) substrate.

The substrate 101 may have a top surface, which extends in the X direction and the Y direction. The top surface of the substrate 101 may be perpendicular to the Z direction. The substrate 101 may include a cell array region CAR and a contact region CNTR, which provides wiring for the cell transistors CTR and the cell capacitors CAP.

A peripheral circuit and a wiring layer connected to the peripheral circuit may be formed on the substrate 101. For example, the peripheral circuit may include a flat metal-oxide-semiconductor field-effect transistor (MOSFET), which forms a sub word line driver, a sense amplifier, or the like. A lower insulating layer may be formed on the substrate 101 to cover the peripheral circuit and the wiring layer.

The substrate 101 may include the cell array region CAR and the contact region CNTR. The cell transistors CTR may be in the cell array region CAR, and contact electrodes 124 and conductive contacts 140 may be in the contact region CNTR.

A compound semiconductor layer 110 may be on the substrate 101. A lower monocrystalline semiconductor layer 125 may be on the compound semiconductor layer 110. The lower monocrystalline semiconductor layer 125 may be separated from the substrate 101 by the compound semiconductor layer 110 therebetween. The compound semiconductor layer 110 and the lower monocrystalline semiconductor layer 125 may extend in the cell array region CAR and the contact region CNTR.

Each of the cell transistors CTR may include a transistor body 220, word lines 230, a gate insulating layer 240, and a bit line 250. Each of the cell capacitors CAP may include a first electrode EL1, a second electrode EL2, and a capacitor dielectric layer DL.

A plurality of transistor bodies 220 may be on the substrate 101. The transistor bodies 220 may extend in the Y direction. The transistor bodies 220 may be separated from each other in the Z direction.

The transistor bodies 220 may include an undoped semiconductor material or a doped semiconductor material. For example, the transistor bodies 220 may include polysilicon.

The transistor bodies 220 may include amorphous metal oxide, polycrystalline metal oxide, or a combination thereof. For example, the transistor bodies 220 may include at least one of In—Ga oxide (IGO), In—Zn oxide (IZO), and In—Ga—Zn oxide (IGZO).

Each of the transistor bodies 220 may include a first source/drain region 222, a monocrystalline channel layer 224, and a second source/drain region 226. The first source/drain region 222 may be connected to the bit line 250, and the second source/drain region 226 may be connected to the first electrode EL1 of each of the cell capacitors CAP.

The monocrystalline channel layer 224 may be between the first source/drain region 222 and the second source/drain region 226, e.g., in the Y direction. The monocrystalline channel layer 224 may be connected to the first source/drain region 222 and the second source/drain region 226. The first source/drain region 222 and the second source/drain region 226 may include a semiconductor material doped with high-concentration n-type dopants.

The word lines 230 may be adjacent to the transistor bodies 220. Each of the word lines 230 may extend in the X direction. According to example embodiments, the semiconductor memory device 10 may include a dual-gate transistor structure. According to example embodiments, each of the word lines 230 may be on the top surface and bottom surface of a corresponding one of the transistor bodies 220. Two adjacent word lines 230 may be separated from each other by one of the transistor bodies 220 therebetween. Each of the transistor bodies 220 may be between two adjacent word lines 230.

According to example embodiments, the word lines 230 may include at least one of a doped semiconductor material (e.g., doped silicon or doped germanium), conductive metal nitride (e.g., titanium nitride or tantalum nitride), metal (e.g., tungsten, titanium, or tantalum), and a metal-semiconductor compound (e.g., tungsten silicide, cobalt silicide, or titanium silicide).

A plurality of spacers 232 may be between a plurality of bit lines 250 and a plurality of word lines 230. A plurality of spacers 232 may be at the same level as a plurality of word lines 230 in the Z direction, e.g., each of the plurality of spacers 232 may be aligned with a corresponding one of the plurality of word lines 230 in the Z direction. A first side wall of each of the spacers 232 may be in contact with one of the bit lines 250. A second side wall of each of the spacers 232 may be in contact with a corresponding one of the word lines 230.

Among the spacers 232, a lower spacer 232L is most adjacent to the substrate 101. The lower spacer 232L may have the greatest thickness (i.e., Z-direction length) among the spacers 232. The spacers 232 and the lower spacer 232L may include, e.g., silicon nitride, silicon oxynitride, or silicon oxide.

The gate insulating layer 240 may be between the word lines 230 and the transistor bodies 220. The gate insulating layer 240 may have a uniform thickness and thus have a conformal structure. The gate insulating layer 240 may cover the top, bottom, and side surfaces of each of the word lines 230.

In example embodiments, the gate insulating layer 240 may include at least one of ferroelectrics and a high-k dielectric material having a higher dielectric constant than silicon oxide. For example, the gate insulating layer 240 may include at least one of hafnium oxide ($HfO_2$), hafnium silicate ($HfSiO_4$), hafnium oxynitride (HfON), hafnium silicon oxynitride (HfSiON), lanthanum oxide (LaO), lanthanum aluminate ($LaAlO_3$), zirconium oxide ($ZrO_2$), zirconium silicate ($ZrSiO_4$), zirconium oxynitride (ZrON), zirconium silicon oxynitride (ZrSiON), tantalum oxide ($Ta_2O_5$), titanium oxide ($TiO_2$), barium strontium titanium oxide ($BaSrTiO_3$), barium titanium oxide ($BaTiO_3$), lead zirconate titanate (PZT), strontium titanate borosilicate (STB), bismuth ferrite (BFO), strontium titanium oxide ($SrTiO_3$), yttrium oxide (YO), aluminum oxide ($Al_2O_3$), and lead scandium tantalum oxide (PbScTaO).

A spacer burying layer 262 may be between a plurality of transistor bodies 220. The spacer burying layer 262 may be at the same vertical level as each of the word lines 230 from the substrate 101 in the Z direction, e.g., the spacer burying layer 262 may be aligned with a corresponding one of the word lines 230 in the Y direction. A spacer liner 264 may be on the top surface and bottom surface of the spacer burying layer 262.

An isolation insulating layer 266 may be between two adjacent spacer burying layers 262 and between two adjacent word lines 230, e.g., in the Z direction. For example, the gate insulating layer 240 may be between the isolation insulating layer 266 and the word lines 230, and the spacer liner 264 may be between the isolation insulating layer 266 and the spacer burying layer 262.

Each of the bit lines 250 may extend in the Z direction on the substrate 101. The bit lines 250 may be arranged in the X direction and the Y direction. The bit lines 250 may include at least one of a doped semiconductor material (e.g., doped silicon or doped germanium), conductive metal nitride (e.g., titanium nitride or tantalum nitride), metal (e.g., tungsten, titanium, or tantalum), and a metal-semiconductor compound (e.g., tungsten silicide, cobalt silicide, or titanium silicide).

A bit line insulating layer 252 may extend in the Z direction and may be around the bit lines 250. The bottom surface of the bit line insulating layer 252 may be in contact with the top surface of the lower spacer 232L.

Each of the cell capacitors CAP may include the first electrode EL1, the second electrode EL2, and the capacitor dielectric layer DL. The first electrode EL1 may be connected to the second source/drain region 226. The first electrode EL1 may have a cup shape, which has a side surface parallel with the Y direction and a bottom surface perpendicular to the Y direction, e.g., the cup shape may contact a corresponding transistor body 220 and overlap the two word lines 230 adjacent to and separated by the corresponding transistor body. For example, as shown in FIG. 2B, a horizontal cross-section of the first electrode EL1 may have a 90-degree rotated "U" shape.

The capacitor dielectric layer DL may cover the surface of the first electrode EL1. The capacitor dielectric layer DL may have a uniform thickness. Accordingly, the capacitor dielectric layer DL may have a conformal shape. The second electrode EL2 may be separated from the first electrode EL1 by the capacitor dielectric layer DL therebetween.

In example embodiments, the first electrode EL1 and the second electrode EL2 may include a doped semiconductor material, conductive metal nitride (e.g., titanium nitride, tantalum nitride, niobium nitride, or tungsten nitride), metal (e.g., ruthenium, iridium, titanium, or tantalum), or conductive metal oxide (e.g., iridium oxide or niobium oxide).

The contact electrodes 124 may be in the contact region CNTR. The contact electrodes 124 may be on the lower monocrystalline semiconductor layer 125. The contact electrodes 124 may be stacked in the Z direction. For example, as illustrated in FIG. 2C, a plurality of the contact electrodes 124 may be stacked on top of each other in the Z direction on the lower monocrystalline semiconductor layer 125, e.g., the lower monocrystalline semiconductor layer 125 may be between the substrate 101 and the stack of the contact electrodes 124.

The lower monocrystalline semiconductor layer 125 may include a semiconductor material. For example, the lower monocrystalline semiconductor layer 125 may include a monocrystalline semiconductor material, e.g., Si.

The contact electrodes 124 may include a conductive material. For example, the contact electrodes 124 may include at least one of a doped semiconductor material (e.g., doped silicon or doped germanium), conductive metal nitride (e.g., titanium nitride or tantalum nitride), metal (e.g., tungsten, titanium, or tantalum), and a metal-semiconductor compound (e.g., tungsten silicide, cobalt silicide, or titanium silicide).

An uppermost contact electrode 124U may be at the top among the contact electrodes 124, e.g., the uppermost contact electrode 124U may be above all the contact electrodes 124. The uppermost contact electrode 124U may be farthest from the substrate 101 among the contact electrodes 124. The contact electrodes 124 may be between the uppermost contact electrode 124U and the lower monocrystalline semiconductor layer 125.

A dummy electrode 124D may be above the uppermost contact electrode 124U, e.g., the uppermost contact electrode 124U may be between the dummy electrode 124D and the stacked contact electrodes 124. A stopper pattern 133 may be on the dummy electrode 124D and may cover the top surface of the dummy electrode 124D.

According to example embodiments, the contact electrodes 124 and the uppermost contact electrode 124U may extend in the X direction with a certain width in the Y direction (e.g., gray horizontal lines in FIG. 2). The contact electrodes 124 and the uppermost contact electrode 124U may extend in the contact region CNTR and the cell array region CAR. Each of the contact electrodes 124 and the uppermost contact electrode 124U may be connected to the monocrystalline channel layer 224.

According to example embodiments, the contact electrodes 124 and the uppermost contact electrode 124U may have different lengths in the X direction. For example, each of the contact electrodes 124 and the uppermost contact electrode 124U may protrude further than an upper one in the X direction. For example, the contact electrodes 124 may protrude farther than the uppermost contact electrode 124U in the X direction, e.g., a portion of an upper surface of an uppermost one of the stacked contact electrodes 124 may be exposed by the uppermost contact electrode 124U.

Each of the contact electrodes 124 and the uppermost contact electrode 124U may provide a region for a conductive contact 140. For example, since each of the contact electrodes 124 may protrude farther than the uppermost contact electrode 124U in the X direction, the contact electrodes 124 and the uppermost contact electrode 124U may form a first step structure ST1 and a second step structure ST2. In other words, the different vertical levels in the Z direction of the uppermost contact electrode 124U and the uppermost one of the contact electrodes 124 may define a step (e.g., stair) cross-sectional profile (FIG. 2C). For example, as illustrated in FIG. 2C, the conductive contact 140 may be on the step structure.

The first and second step structures ST1 and ST2 may be insulated by an interlayer insulating layer 122. The first and second step structures ST1 and ST2 may be separated from each other by the interlayer insulating layer 122 in the Y direction. Accordingly, the first and second step structures ST1 and ST2 may respectively provide wiring for different sub cell arrays SCA.

Each of the contact electrodes 124 and the uppermost contact electrode 124U may have a variable thickness (i.e., Z-direction length). For example, the uppermost contact electrode 124U may include a first connection portion 124UA, which has a first thickness T1, and a first landing portion 124UB, which has a second thickness T2.

According to example embodiments, the first thickness T1 may be different from the second thickness T2. According to example embodiments, the second thickness T2 may be greater than the first thickness T1. According to example embodiments, a difference between the second thickness T2 and the first thickness T1 may be about 30 nm or less.

According to example embodiments, the first landing portion 124UB of the uppermost contact electrode 124U may be farther from the cell array region CAR than the first connection portion 124UA of the uppermost contact electrode 124U, e.g., along the X direction. According to example embodiments, the first landing portion 124UB of the uppermost contact electrode 124U may be connected to the monocrystalline channel layer 224 through the first connection portion 124UA of the uppermost contact electrode 124U.

According to example embodiments, the first landing portion 124UB of the uppermost contact electrode 124U may provide landing for the conductive contact 140. According to example embodiments, the first landing portion 124UB of the uppermost contact electrode 124U may be in contact with the conductive contact 140.

Similarly, each of the contact electrodes 124 may include a second connection portion 124A having the first thickness T1 and a second landing portion 124B having the second thickness T2. According to example embodiments, the second landing portion 124B of each contact electrode 124 may be farther from the cell array region CAR than the second connection portion 124A of the contact electrode 124. According to example embodiments, the second landing portion 124B of the contact electrode 124 may be connected to the monocrystalline channel layer 224 through the second connection portion 124A of the contact electrode 124.

According to example embodiments, the second landing portion 124B of the contact electrode 124 may provide landing of the conductive contact 140. According to example embodiments, the second landing portion 124B of the contact electrode 124 may be in contact with the conductive contact 140.

According to example embodiments, a first length L1 that is an X-direction length of the first landing portion 124UB of the uppermost contact electrode 124U may be different from a second length L2 that is an X-direction length of the second landing portion 124B of the contact electrode 124. According to example embodiments, the first length L1 may be greater than the second length L2.

According to example embodiments, the first landing portion 124UB of the uppermost contact electrode 124U may overlap with the second connection portion 124A of the contact electrode 124 in the Z direction. According to example embodiments, the first landing portion 124UB of the uppermost contact electrode 124U may not overlap with the second landing portion 124B of the contact electrode 124. According to example embodiments, the first landing portion 124UB of the uppermost contact electrode 124U may be separated from, e.g., discontinuous with respect to, the second landing portion 124B of the contact electrode 124 in a horizontal direction (e.g., the X direction).

According to example embodiments, an upper insulating layer 135 may cover the first and second step structures ST1 and ST2, the interlayer insulating layer 122, and the conductive contacts 140.

The interlayer insulating layer 122 and the upper insulating layer 135 may include an insulating material. For example, the interlayer insulating layer 122 and the upper insulating layer 135 may include silicon oxide. Accordingly, the interlayer insulating layer 122 may be integrated with the upper insulating layer 135, e.g., into a uniform and seamless structure, and a boundary may not be formed between the interlayer insulating layer 122 and the upper insulating layer 135.

The conductive contacts 140 may include a conductive material. For example, the conductive contacts 140 may include a metal material, e.g., tungsten. A conductive barrier including, e.g., titanium nitride, may be formed between each of the conductive contacts 140 and the upper insulating layer 135.

Figure 3:
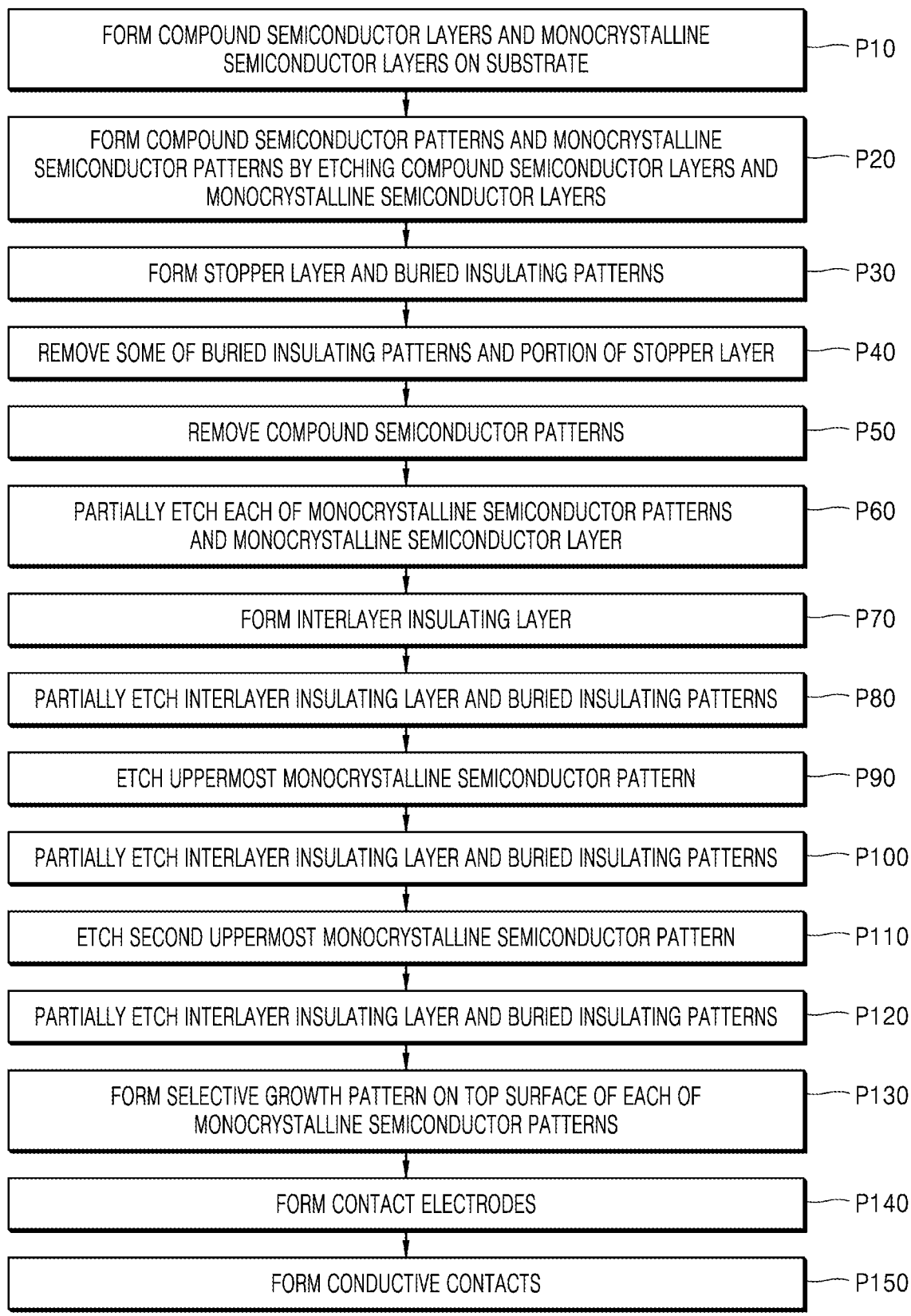
FIG. 3 is a flowchart of a method of manufacturing a semiconductor memory device, according to example embodiments.

FIG. 3 is a flowchart of a method of manufacturing a semiconductor memory device, according to example embodiments. FIGS. 4A to 17B are cross-sectional views of stages in a method of manufacturing a semiconductor memory device, according to example embodiments. In detail, FIGS. 4A, 8A, 9A, 10A, 11A, 12A, 13A, 14A, 15A, 16A, and 17A illustrate portions corresponding to FIG. 2C, and FIGS. 4B to 7, 8B, 9B, 10B, 11B, 12B, 13B, 14B, 15B, 16B, and 17B illustrate portions corresponding to FIG. 2D.

Figure 4A:
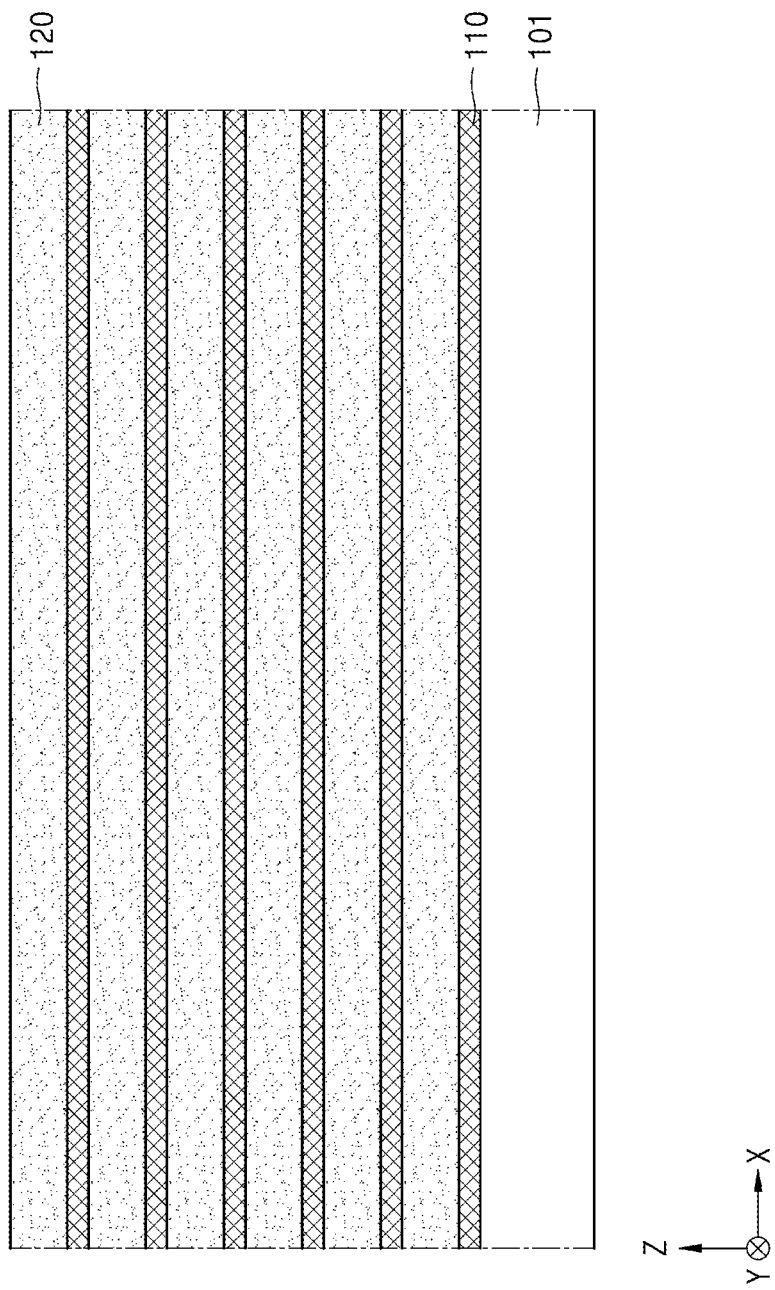
FIGS. 4A to 17B are cross-sectional views of stages in a method of manufacturing a semiconductor memory device, according to example embodiments.
Figure 4B:
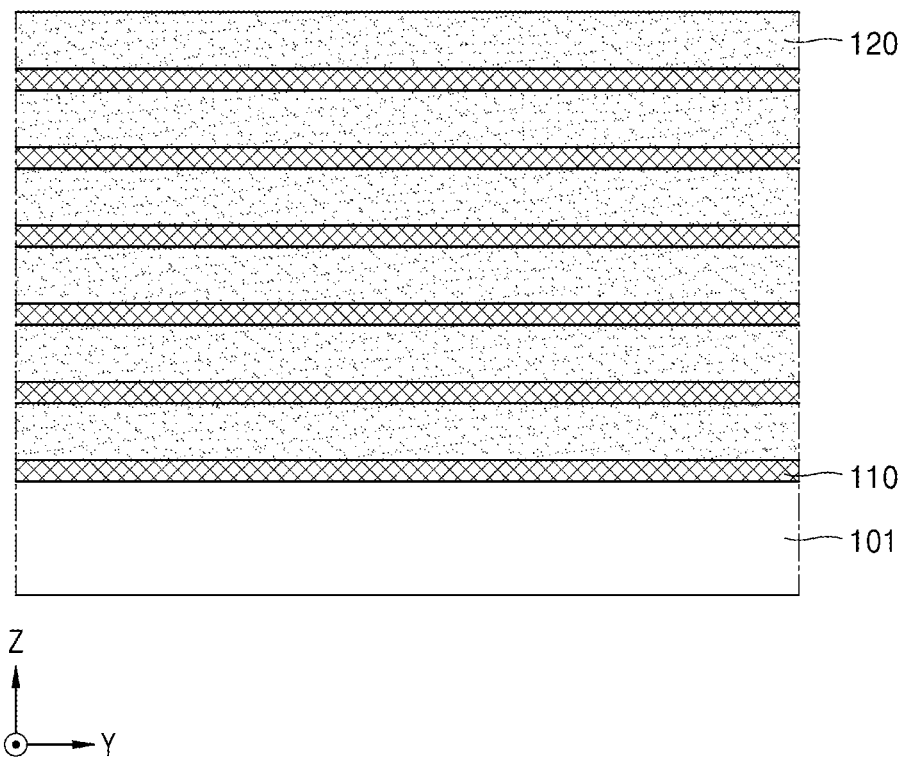

Referring to FIGS. 3, 4A, and 4B, a plurality of compound semiconductor layers 110 and a plurality of monocrystalline semiconductor layers 120 may be formed on the substrate 101 in operation P10. The plurality of compound semiconductor layers 110 and the plurality of monocrystalline semiconductor layers 120 may be stacked alternately on the substrate 101.

The substrate 101 may include a monocrystalline semiconductor material. For example, the substrate 101 may include a semiconductor material, e.g., Si or Ge. For example, the substrate 101 may include an SOI substrate or a GeOI substrate.

Each of the compound semiconductor layers 110 and the monocrystalline semiconductor layers 120 may include a monocrystalline semiconductor material. Each of the compound semiconductor layers 110 may include a semiconductor material, which has a certain etch selectivity with respect to the monocrystalline semiconductor layers 120. According to some embodiments, the compound semiconductor layers 110 may have an etch selectivity with respect to the substrate 101. According to some embodiments, the monocrystalline semiconductor layers 120 may include a material having etching characteristics that are the same as or similar to those of the substrate 101.

According to example embodiments, each of the compound semiconductor layers 110 may include SiGe. According to example embodiments, each of the monocrystalline semiconductor layers 120 may include Si. For example, each of the compound semiconductor layers 110 may include monocrystalline SiGe, and each of the monocrystalline semiconductor layers 120 may include monocrystalline Si.

According to some embodiments, each of the monocrystalline semiconductor layers 120 may include a monocrystalline two-dimensional (2D) semiconductor material or a monocrystalline oxide semiconductor material. For example, the monocrystalline 2D semiconductor material may include $MoS_2$, $WSe_2$, graphene, carbon nanotube, or a combination thereof. For example, the oxide semiconductor material may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_x$-$In_yZn_zO$, $Ga_xZn_ySn_zO$, $Al_xZn_ySn_zO$, $Yb_xGa_yZn_zO$, $In_xGa_yO$, or a combination thereof, where x, y, and z may be 0 to 1. For example, each of the monocrystalline semiconductor layers 120 may include single or multiple layers of the oxide semiconductor material.

According to some embodiments, each of the monocrystalline semiconductor layers 120 may include a material having greater band gap energy than silicon. For example, each of the monocrystalline semiconductor layers 120 may include a material having a band gap energy of about 1.5 eV to about 5.6 eV.

The compound semiconductor layers 110 and the monocrystalline semiconductor layers 120 may be formed by, e.g., chemical vapor deposition (CVD), plasma-enhanced CVD (PECVD), or atomic layer deposition (ALD). According to some embodiments, each of the compound semiconductor layers 110 and the monocrystalline semiconductor layers 120 may be formed by epitaxial growth so as to be monocrystalline. According to some embodiments, each of the compound semiconductor layers 110 and the monocrystalline semiconductor layers 120 may be formed by deposition and then annealed to be monocrystalline. Each of the compound semiconductor layers 110 and the monocrystalline semiconductor layers 120 may have a thickness of several tens of nm.

Subsequently, referring to FIGS. 3, 4B, and 5, a plurality of compound semiconductor patterns 111 and a plurality of monocrystalline semiconductor patterns 121 may be formed by etching the compound semiconductor layers 110 and the monocrystalline semiconductor layers 120 in operation P20. Each of the compound semiconductor patterns 111 and the monocrystalline semiconductor patterns 121 may extend in the X direction with a certain width in the Y direction.

Figure 5:
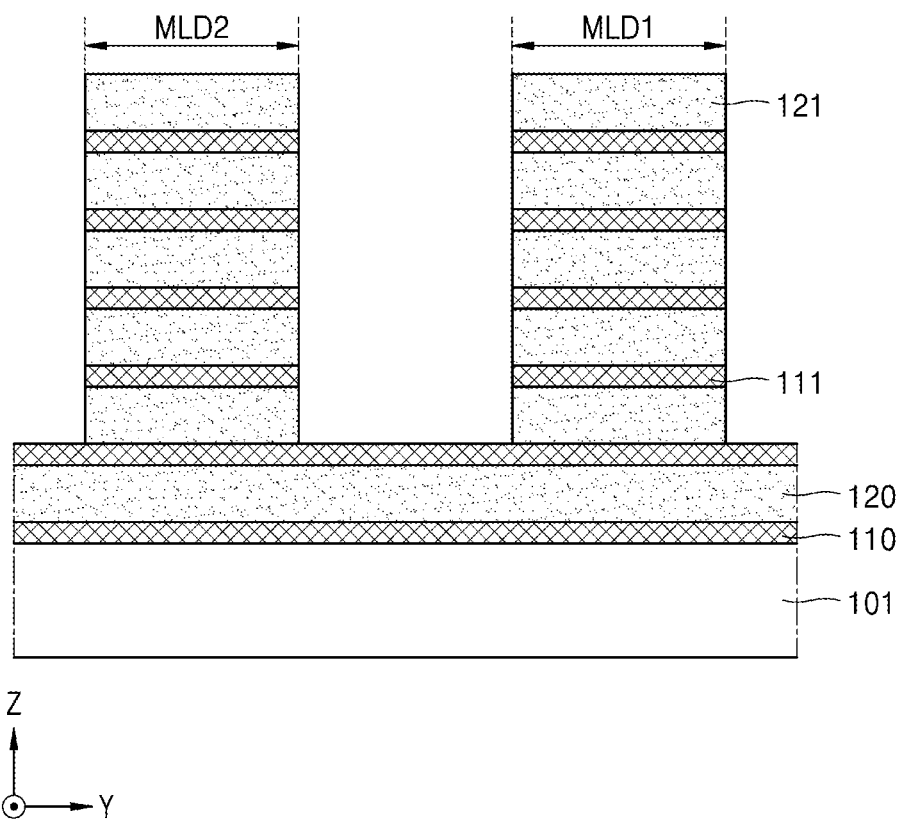

For example, as illustrated in FIG. 5, two compound semiconductor layers 110 adjacent to the substrate 101 (e.g., two lowermost of the compound semiconductor layers 110) and a monocrystalline semiconductor layer 120 (i.e., a lowermost monocrystalline semiconductor layer 120) between the two compound semiconductor layers 110 may not be etched.

According to example embodiments, forming the compound semiconductor patterns 111 and the monocrystalline semiconductor patterns 121 may include forming an etch mask using lithography and anisotropically etching the compound semiconductor layers 110 and the monocrystalline semiconductor layers 120. The monocrystalline semiconductor patterns 121 may constitute a first mold MLD1 and a second mold MLD2. According to example embodiments, the first mold MLD1 may be separated from the second mold MLD2 in the Y direction.

Figure 6:
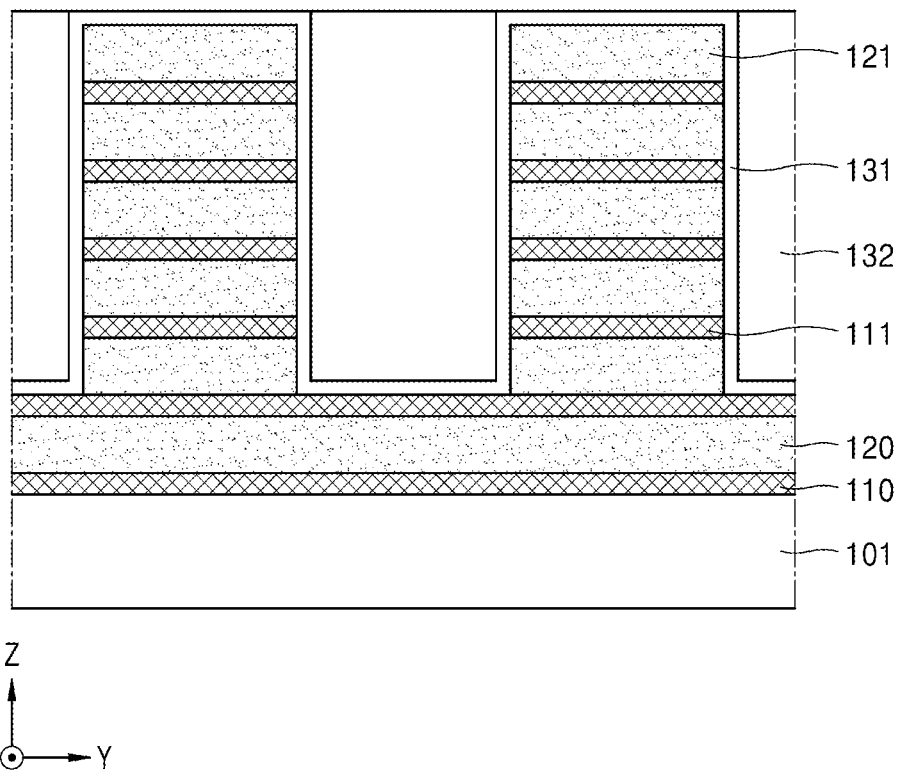

Subsequently, referring to FIGS. 3 and 6, a stopper layer 131 and buried insulating patterns 132 may be formed in operation P30. For example, the stopper layer 131 may be formed conformally on the first and second molds MLD1 and MLD2 of FIG. 5, followed by formation of the buried insulating patterns 132 on the stopper layer 131.

In detail, the stopper layer 131 may be deposited on the compound semiconductor patterns 111 and the monocrystalline semiconductor patterns 121. The stopper layer 131 may cover the compound semiconductor patterns 111 and the monocrystalline semiconductor patterns 121. The stopper layer 131 may have a uniform thickness. Accordingly, the stopper layer 131 may have a conformal shape. For example, the stopper layer 131 may include SiOCN.

After the stopper layer 131 is formed, the buried insulating patterns 132 may be formed by providing an insulating material to sufficiently fill the space between portions of the stopper layer 131, and then performing planarization, e.g., chemical mechanical polishing (CMP). For example, the planarization may include CMP having the top surface of the stopper layer 131 as an end point of etching.

According to example embodiments, the buried insulating patterns 132 may fill the space between portions of the stopper layer 131. The top surface of each of the buried insulating patterns 132 may be at the same level as the top surface of the stopper layer 131. The buried insulating patterns 132 may include, e.g., a silicon oxide film, a silicon oxynitride film, a carbon-containing silicon oxide film, a carbon-containing silicon nitride film, or a carbon-containing silicon oxynitride film.

Figure 7:
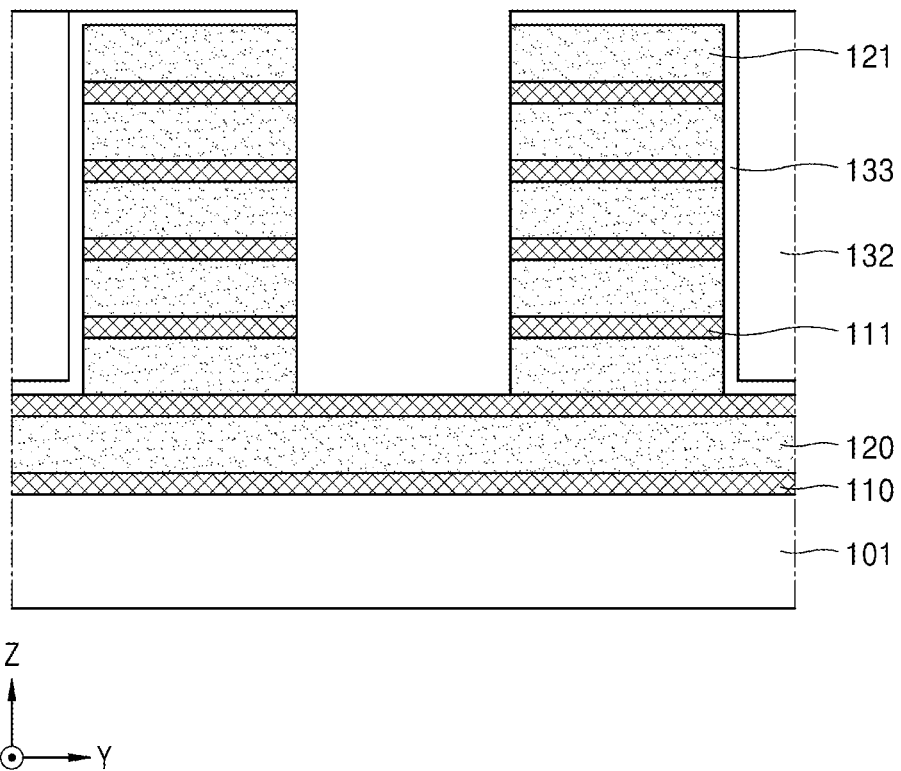
Figure 8A:
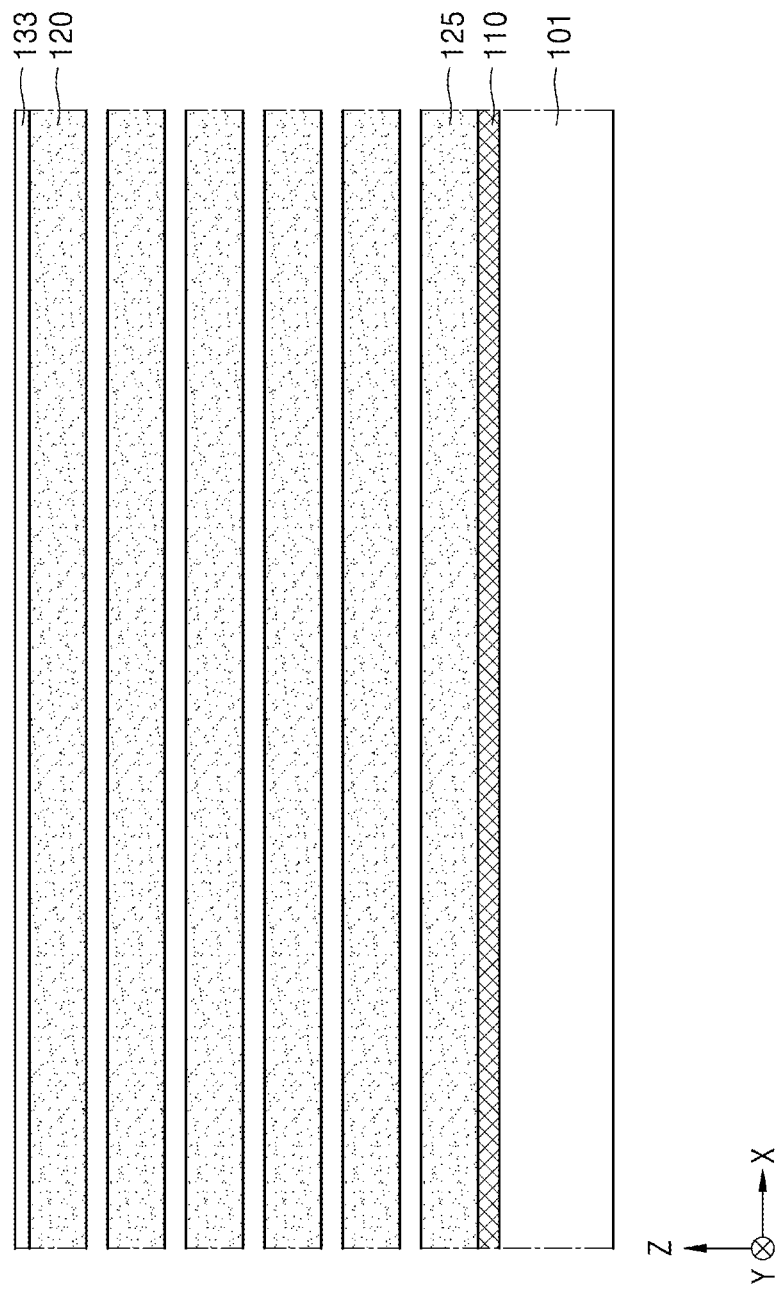
Figure 8B:
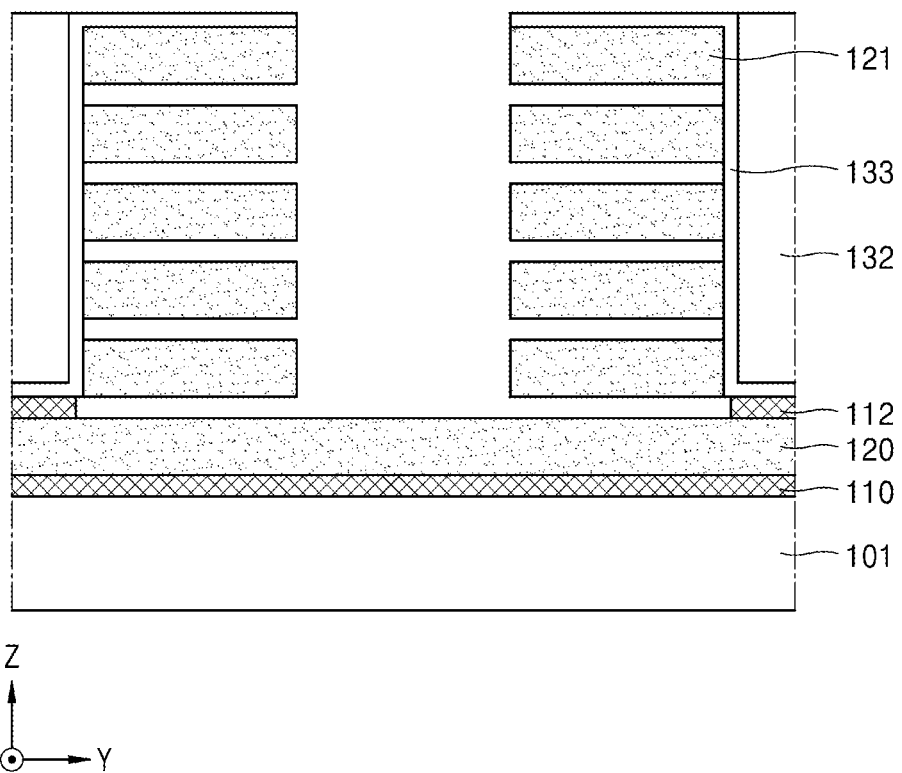
Figure 9A:
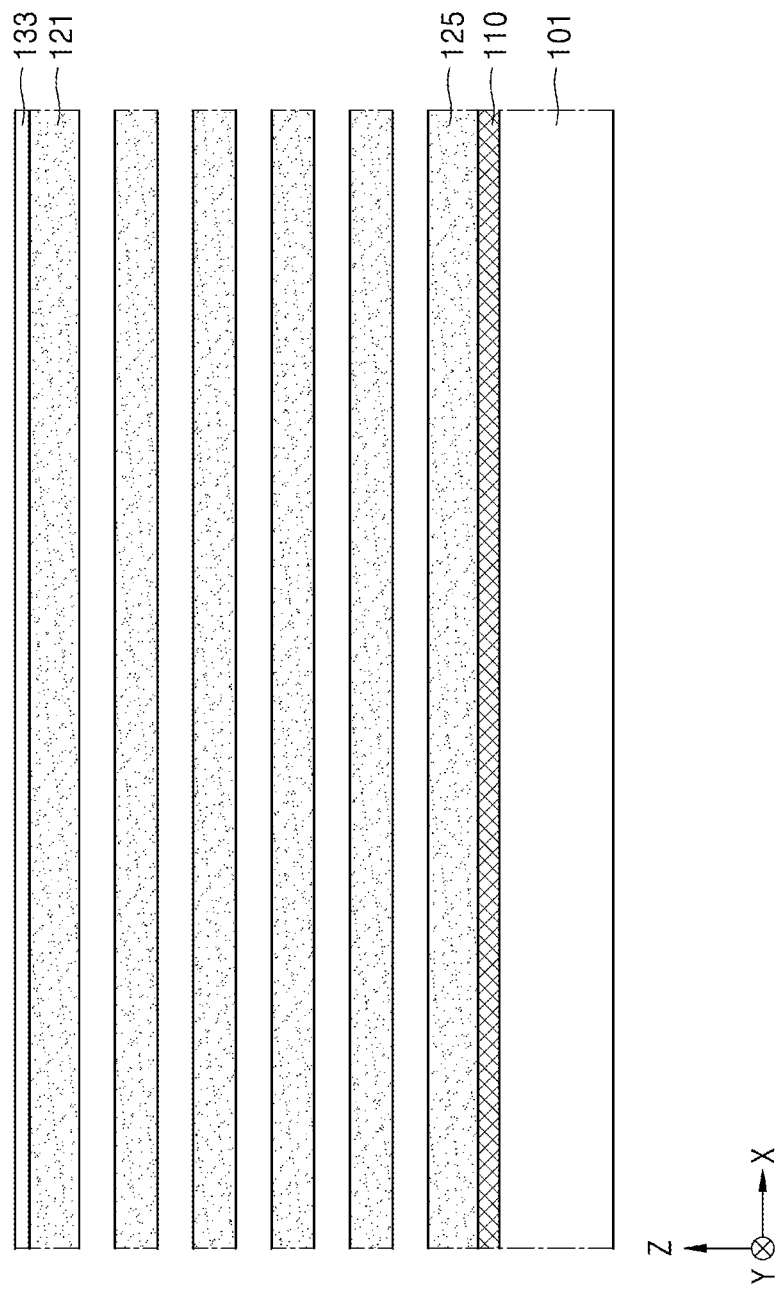
Figure 9B:
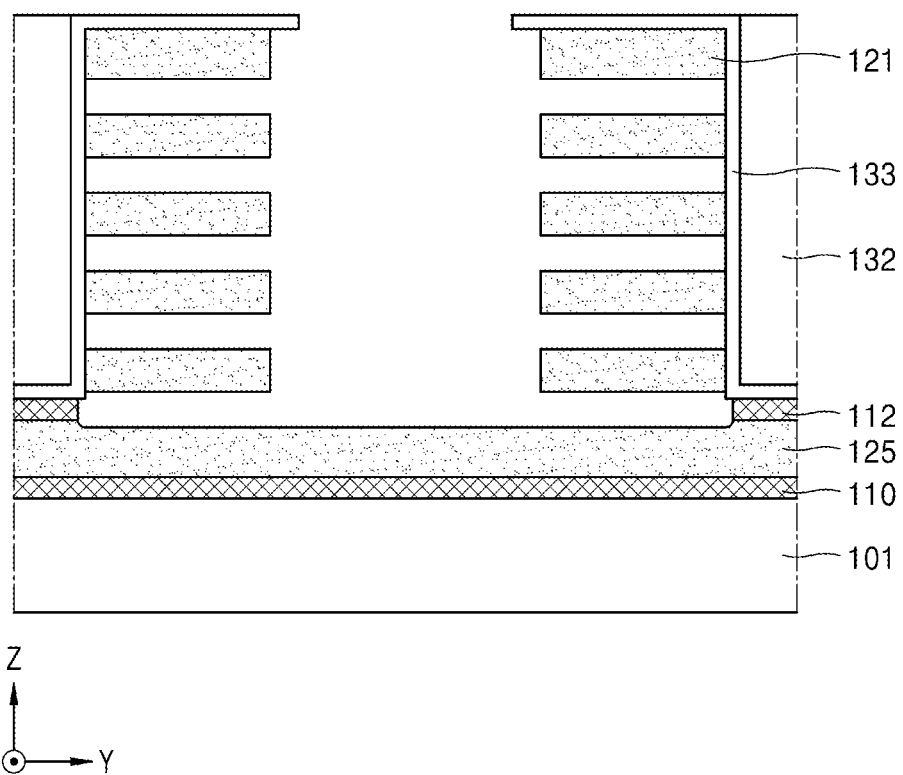

Subsequently, referring to FIGS. 3, 6, and 7, some of the buried insulating patterns 132 and a portion of the stopper layer 131 may be removed in operation P40. For example, the portion of the stopper layer 131 may be removed by a stripping process.

When the portion of the stopper layer 131 is removed, some of the buried insulating patterns 132 may be exposed. The exposed ones of the buried insulating patterns 132 may be removed by wet etching. When some of the buried insulating patterns 132 are removed, side surfaces of the compound semiconductor patterns 111 and the monocrystalline semiconductor patterns 121 may be exposed. Accordingly, stopper patterns 133 may be formed, and the side surfaces of the compound semiconductor patterns 111 and the monocrystalline semiconductor patterns 121 may be exposed.

Subsequently, referring to FIGS. 3, 7, 8A, and 8B, the compound semiconductor patterns 111 may be removed in operation P50.

According to example embodiments, the compound semiconductor patterns 111 may be removed by wet etching. According to example embodiments, because the monocrystalline semiconductor patterns 121 have a high etch selectivity with respect to the compound semiconductor patterns 111, the etching amount of each of the monocrystalline semiconductor patterns 121 may be relatively small during the etching of the compound semiconductor patterns 111.

The compound semiconductor layer 110 on the monocrystalline semiconductor layer 120 may be etched together with the compound semiconductor patterns 111. Accordingly, residual compound semiconductor patterns 112 may be formed. The compound semiconductor layer 110 between the monocrystalline semiconductor layer 120 and the substrate 101 may be protected by the monocrystalline semiconductor layer 120.

Subsequently, referring to FIGS. 3, 8A, 8B, 9A, and 9B, each of the monocrystalline semiconductor patterns 121 and the monocrystalline semiconductor layer 120 may be partially etched in operation P60.

For example, the monocrystalline semiconductor patterns 121 may be etched by wet etching. The monocrystalline semiconductor patterns 121 may be isotropically etched. Accordingly, the Z-direction thickness and Y-direction length of each of the monocrystalline semiconductor patterns 121 may be decreased. Because the bottom and side surfaces of the uppermost monocrystalline semiconductor patterns 121 are exposed but the top surfaces thereof are covered with the stopper patterns 133, a decrease in the thickness of the uppermost monocrystalline semiconductor patterns 121 may be less than that of the other monocrystalline semiconductor patterns 121. Accordingly, after operation P60, the thickness of the uppermost monocrystalline semiconductor patterns 121 may be greater than that of the other monocrystalline semiconductor patterns 121. The uppermost monocrystalline semiconductor patterns 121 corresponds to the dummy electrode 124D.

According to example embodiments, a portion of the monocrystalline semiconductor layer 120, which is not covered with the residual compound semiconductor patterns 112, may be removed. When the monocrystalline semiconductor layer 120 is partially etched, the lower monocrystalline semiconductor layer 125 may be formed.

Figure 10A:
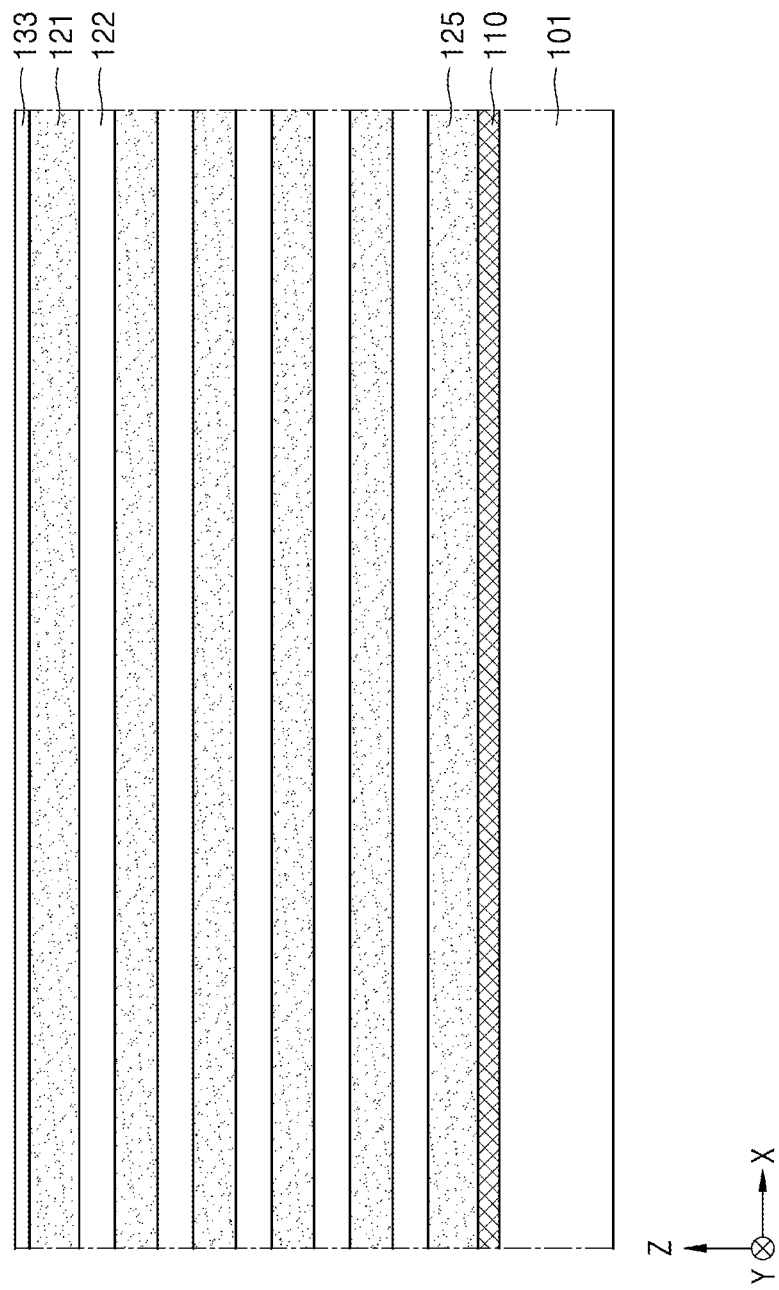
Figure 10B:
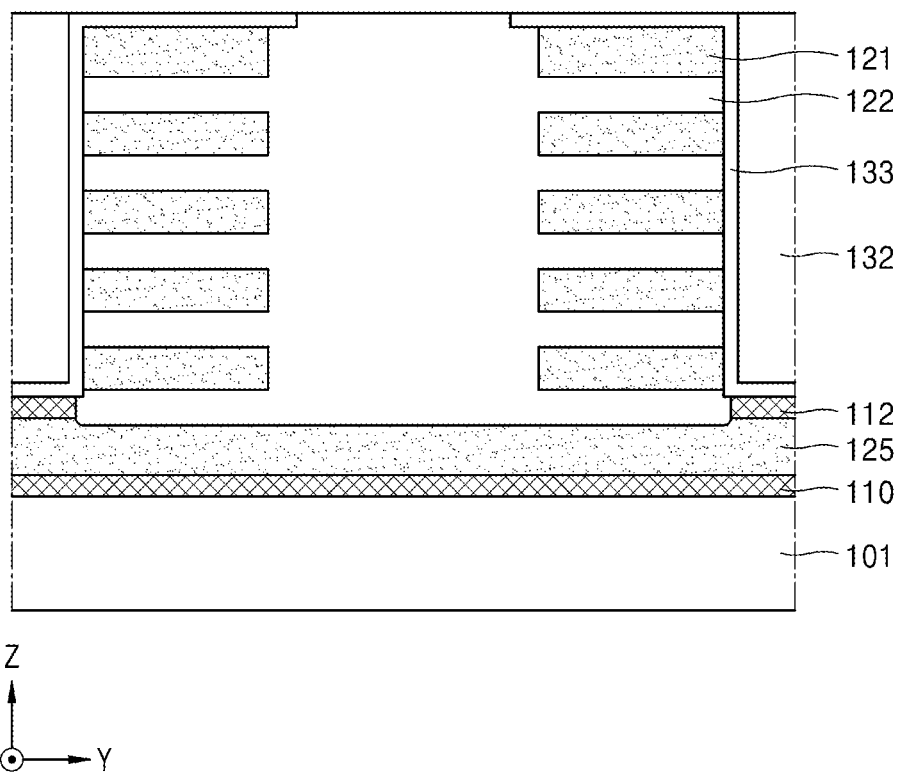
Figure 11A:
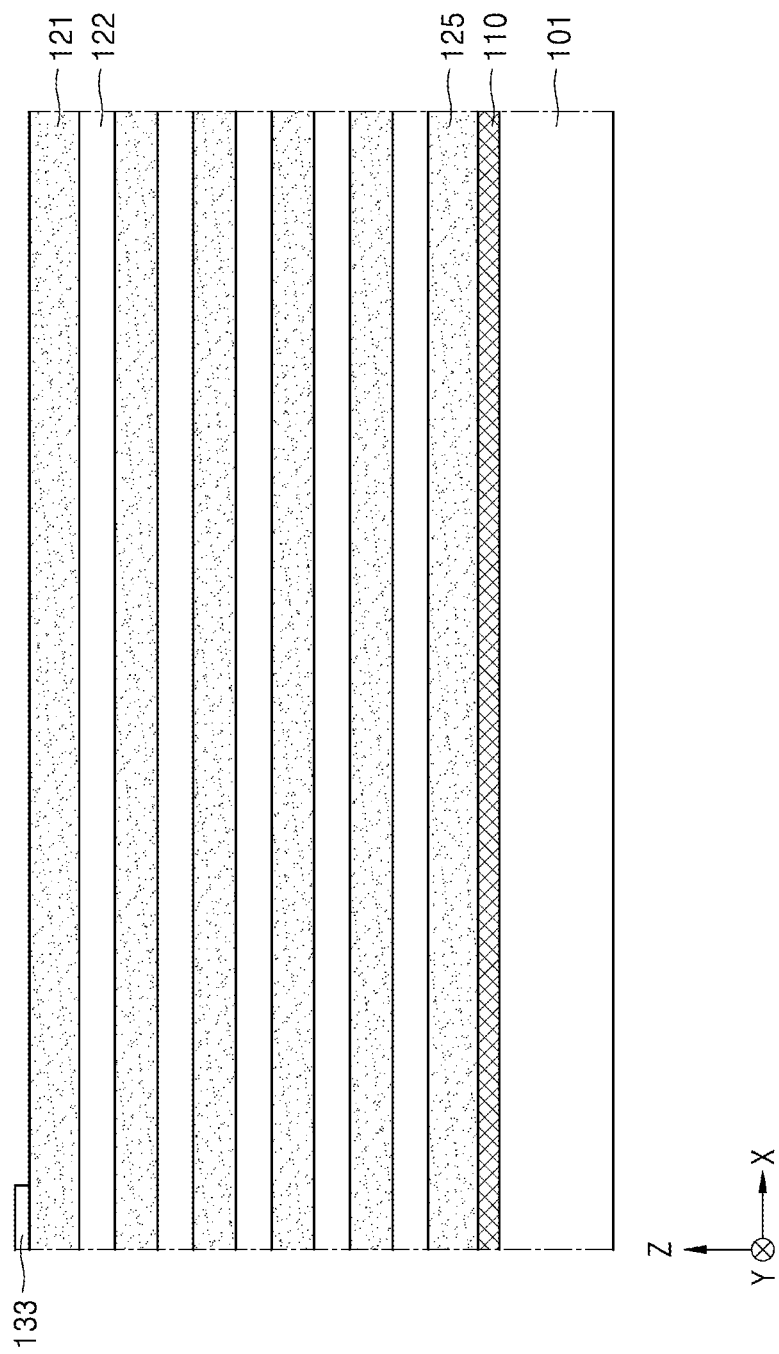
Figure 11B:
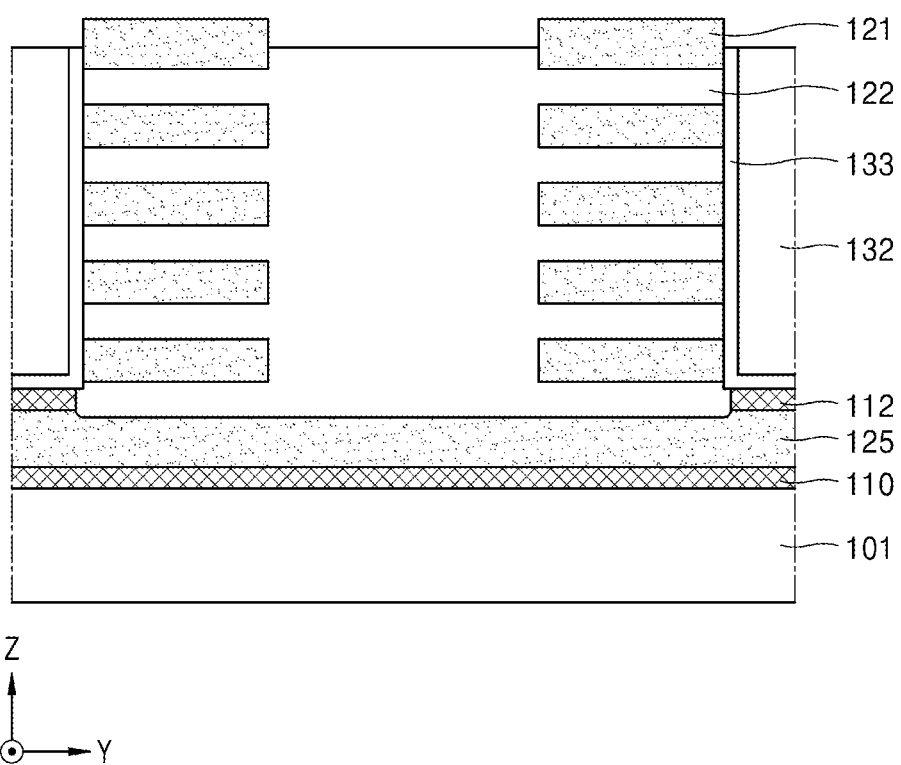
Figure 12B:
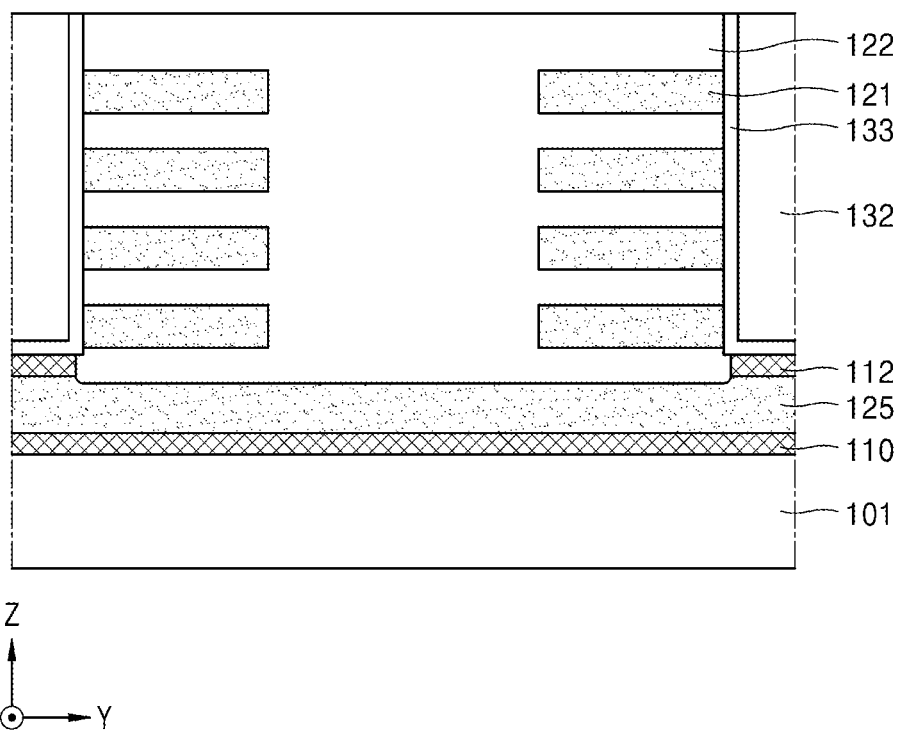
Figure 13A:
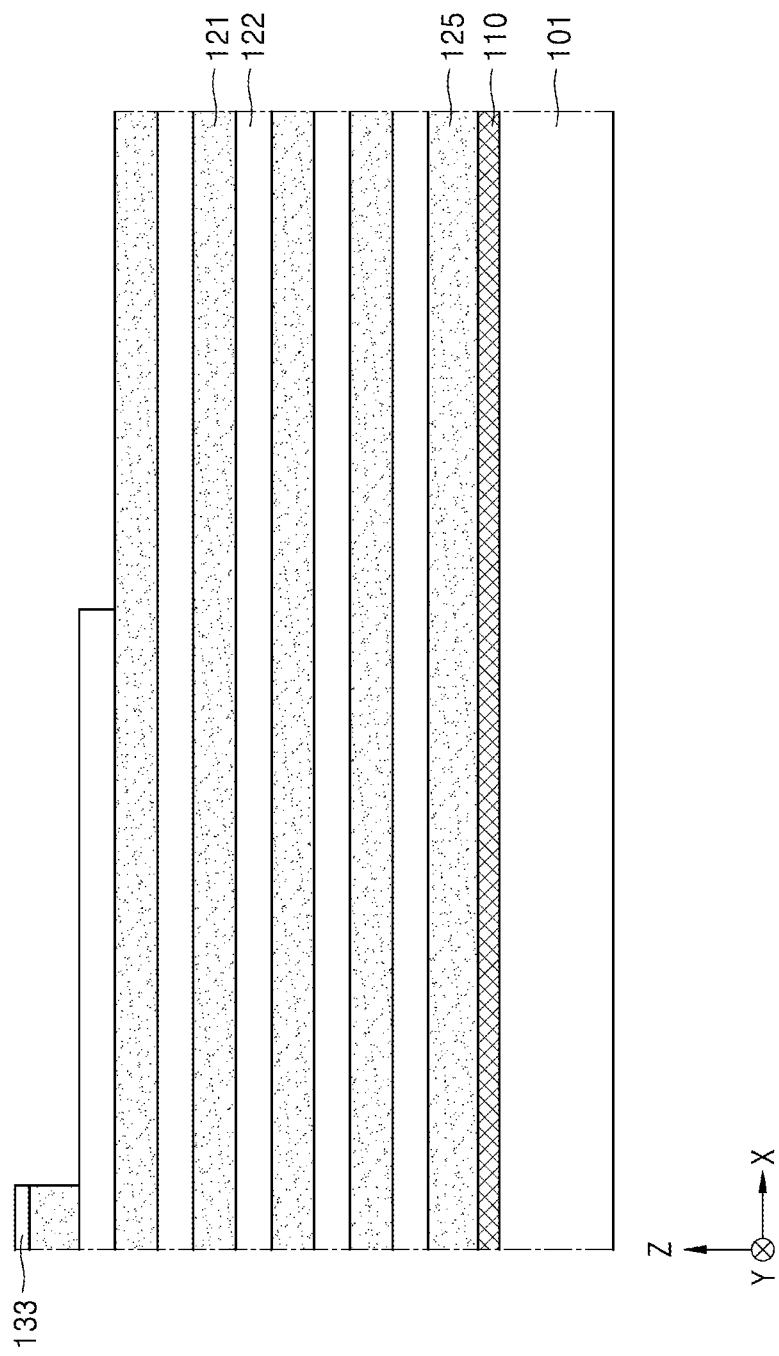
Figure 13B:
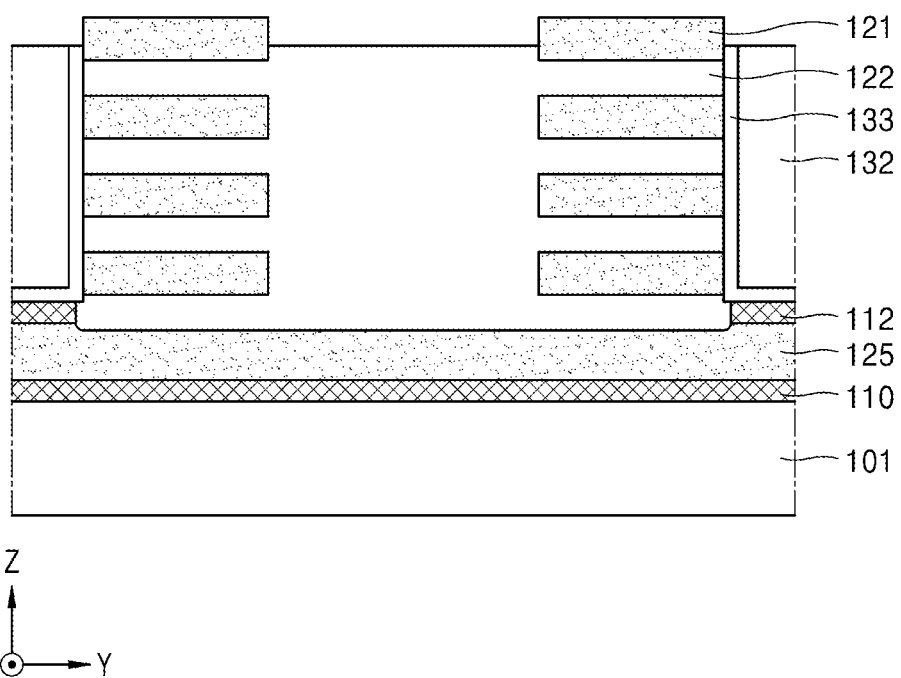
Figure 14A:
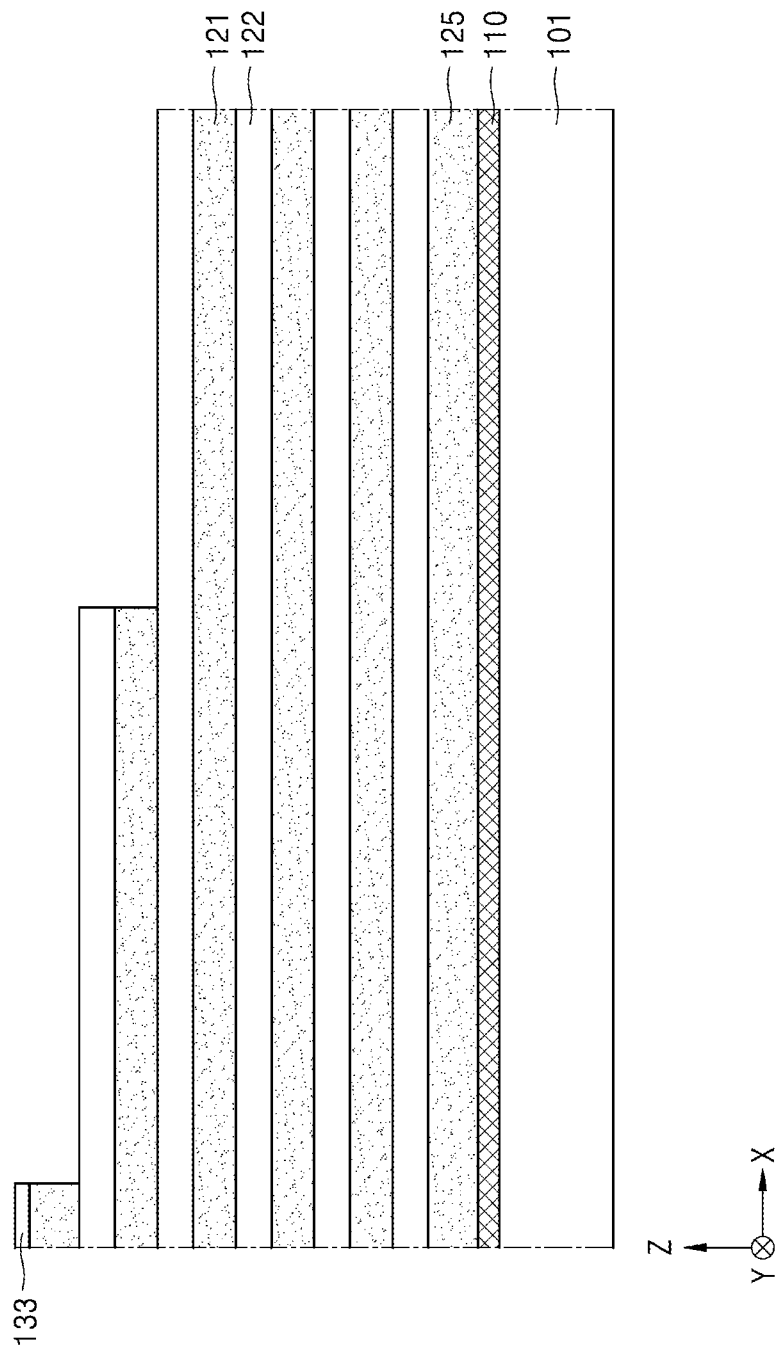
Figure 14B:
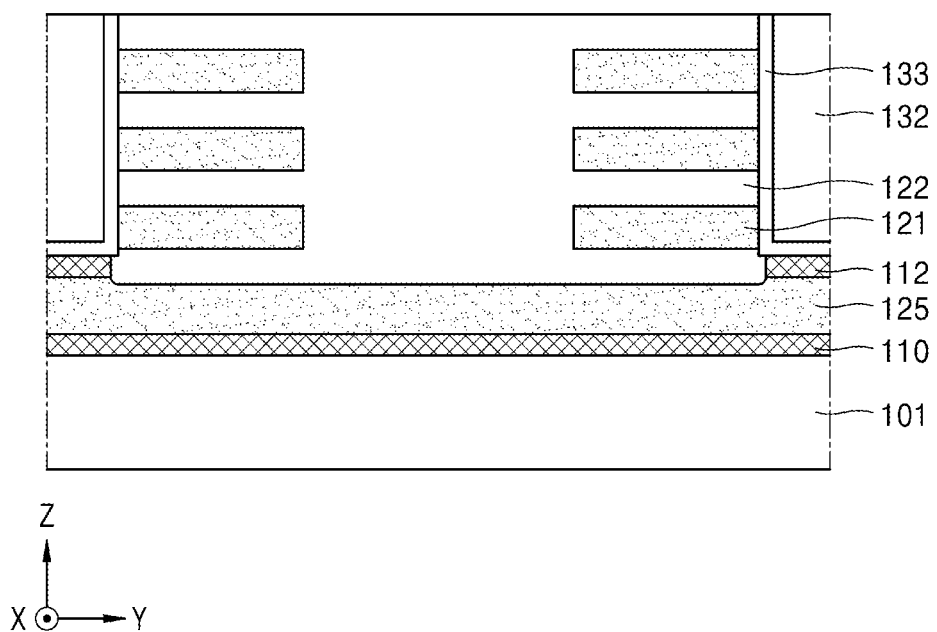
Figure 15A:
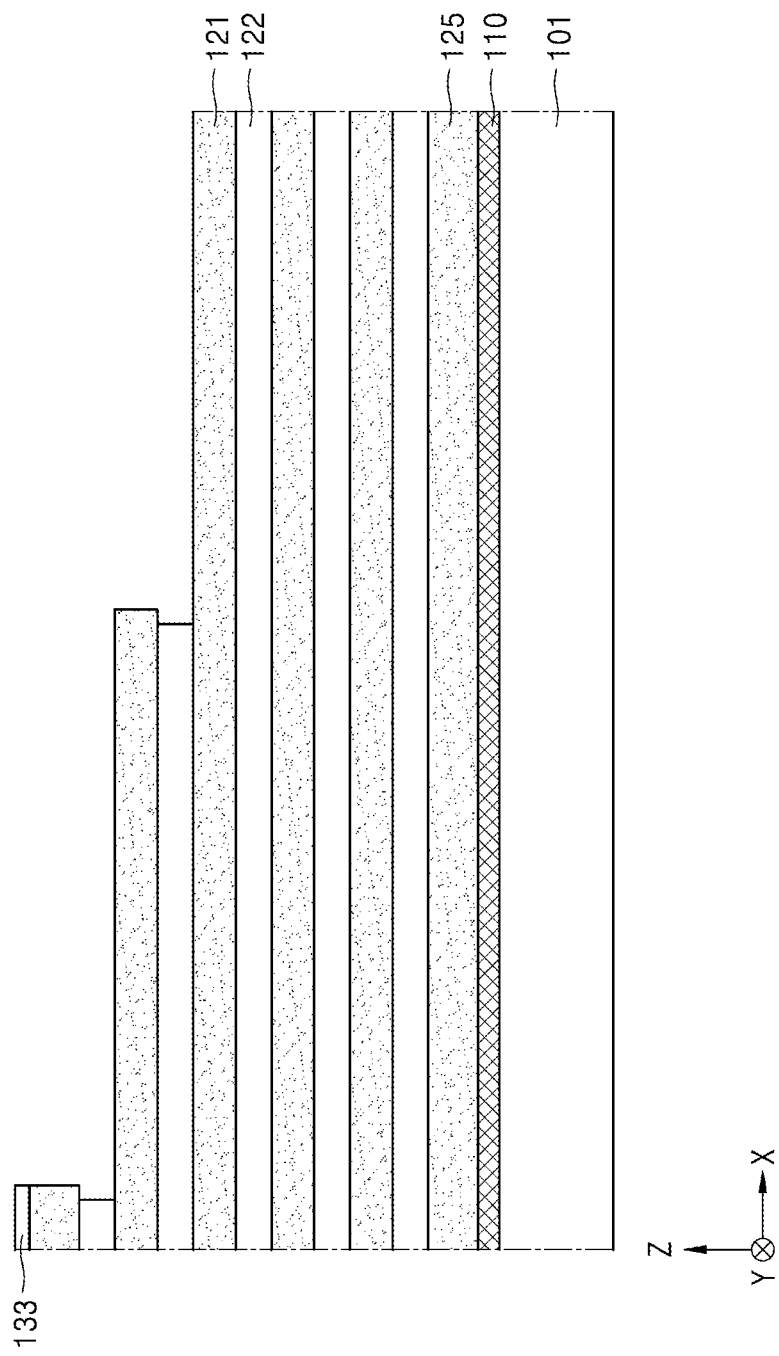
Figure 15B:
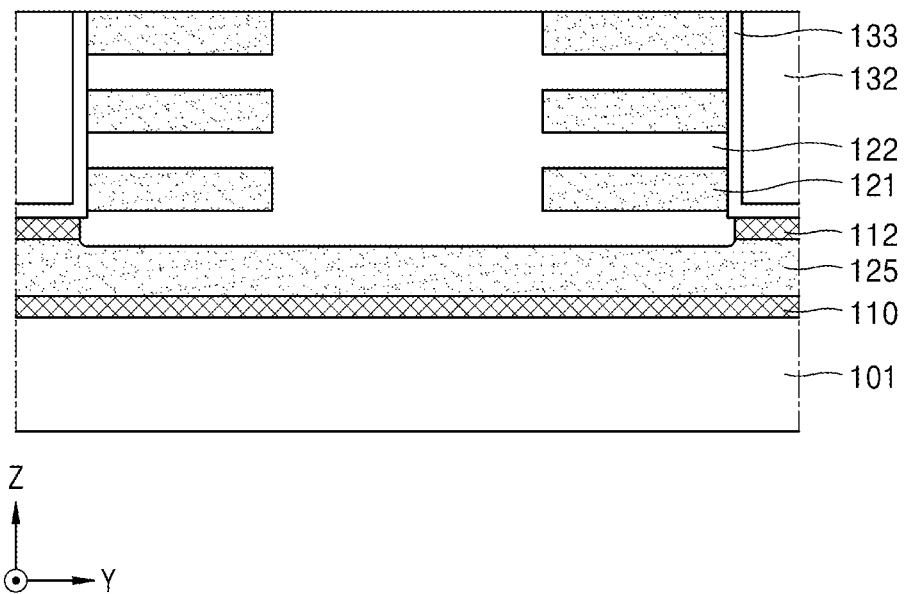
Figure 16A:
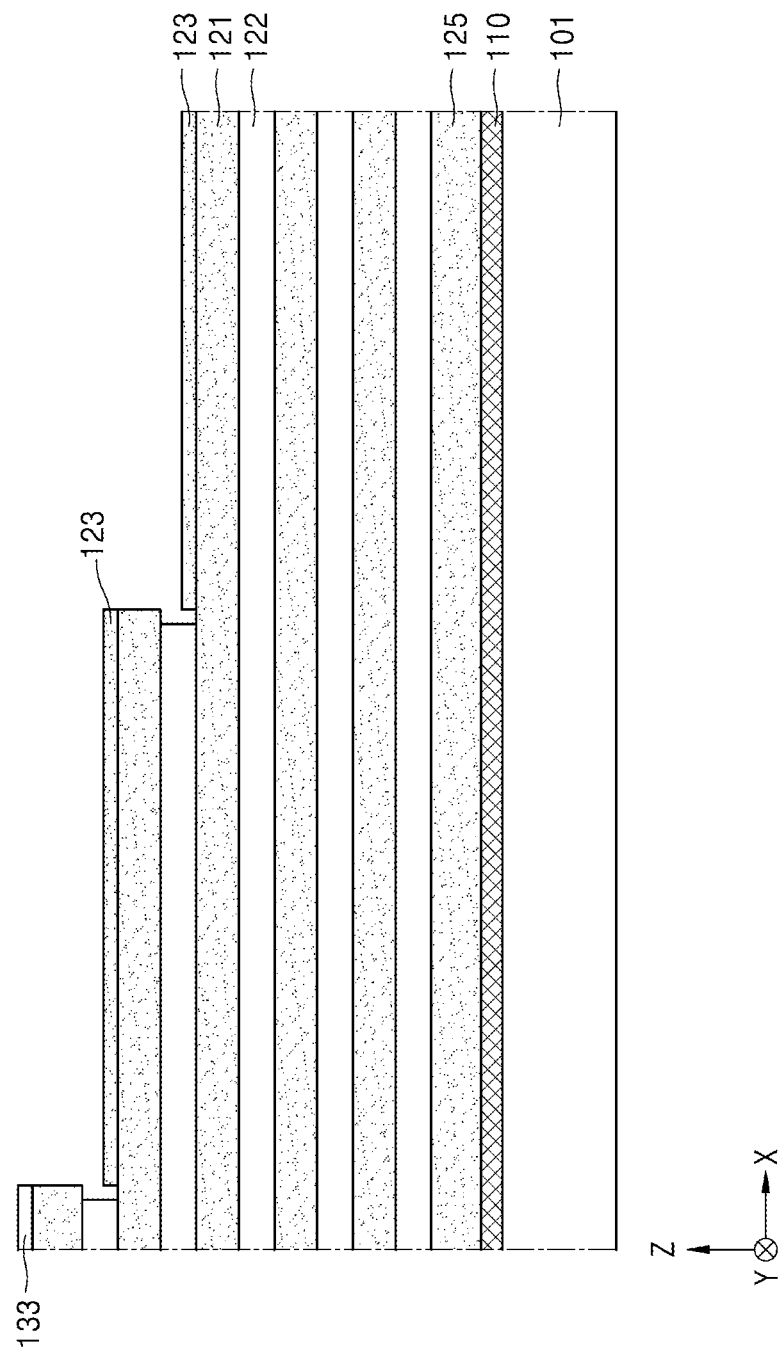
Figure 16B:
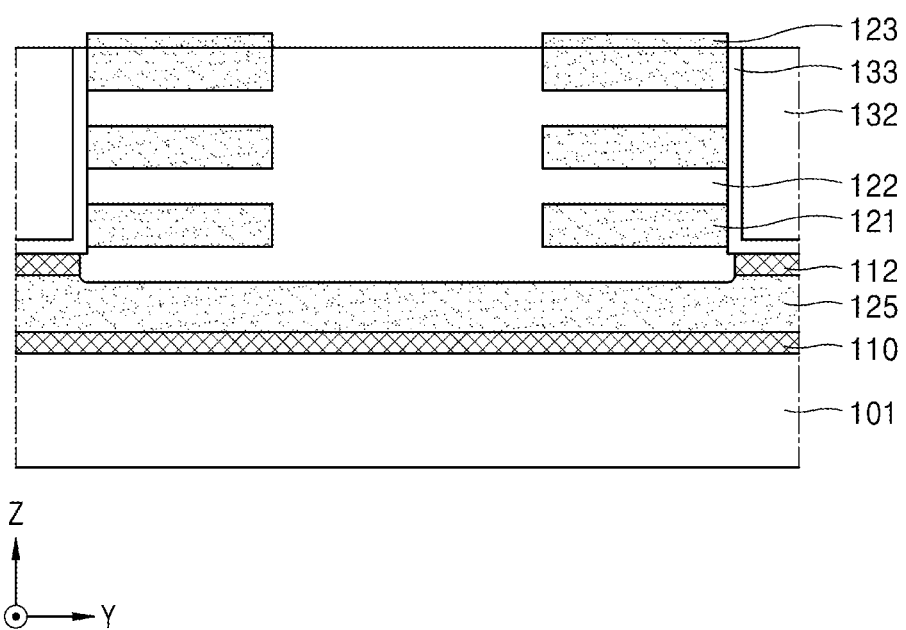
Figure 17A:
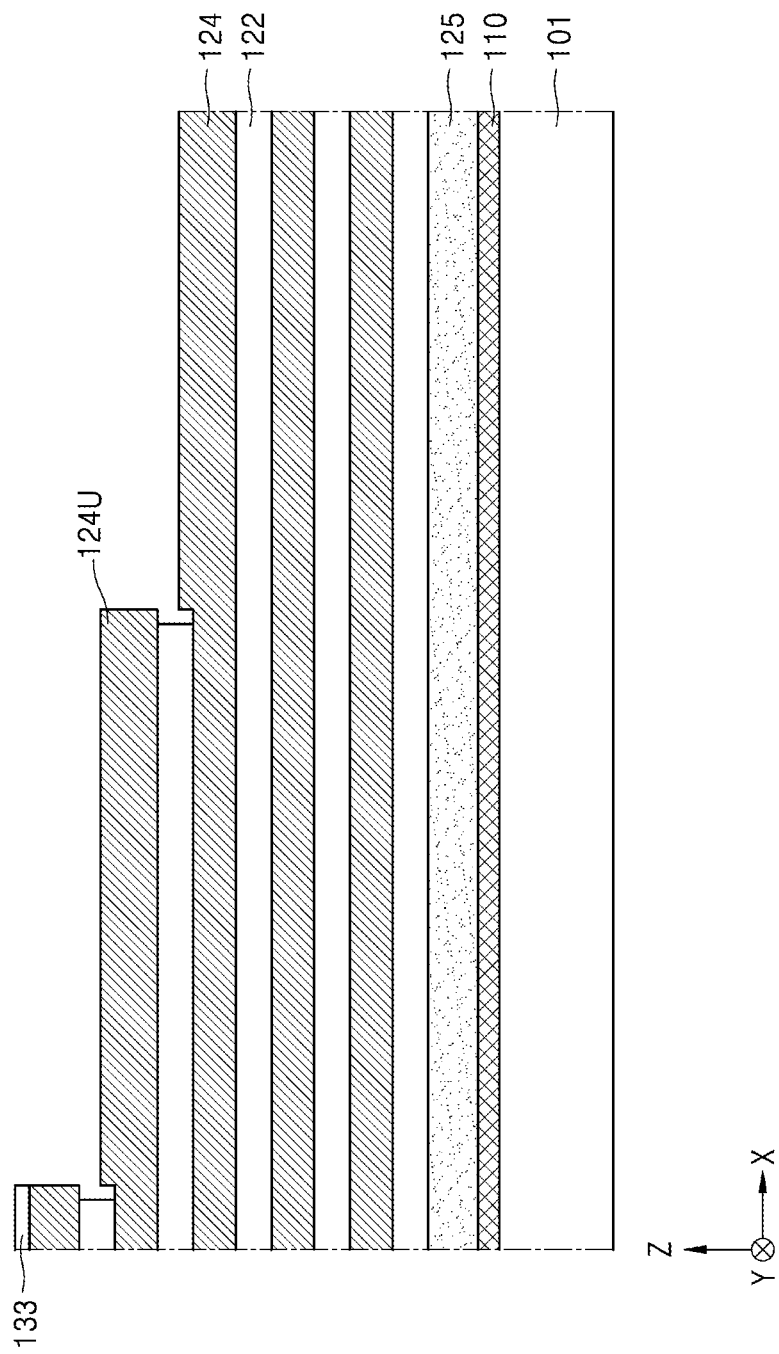
Figure 17B:
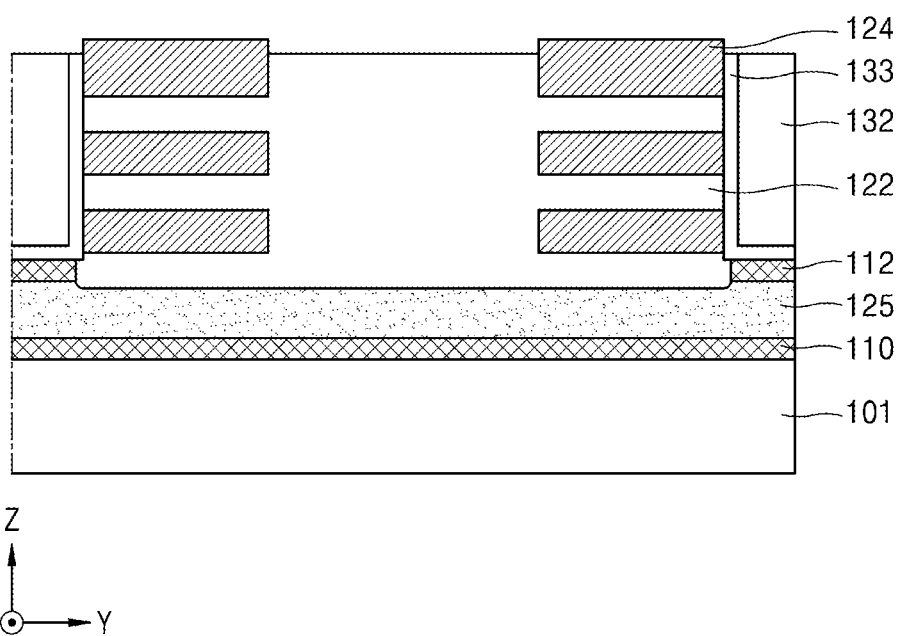

Subsequently, referring to FIGS. 3, 10A, and 10B, the interlayer insulating layer 122 may be formed in operation P70.

According to example embodiments, the interlayer insulating layer 122 may fill spaces among the monocrystalline semiconductor patterns 121 and the lower monocrystalline semiconductor layer 125. According to example embodiments, the interlayer insulating layer 122 may cover the monocrystalline semiconductor patterns 121 and the lower monocrystalline semiconductor layer 125.

The interlayer insulating layer 122 may include an insulating material having a good gap-filling characteristic. For example, the interlayer insulating layer 122 may include silicon oxide.

Subsequently, referring to FIGS. 3 and 10A to 11B, the interlayer insulating layer 122 and the buried insulating patterns 132 may be partially etched in operation P80. The stopper patterns 133 may be etched together with the interlayer insulating layer 122 and the buried insulating patterns 132. When the interlayer insulating layer 122, the buried insulating patterns 132, and the stopper patterns 133 are partially etched, the top surfaces of the uppermost monocrystalline semiconductor patterns 121 may be exposed.

The interlayer insulating layer 122 and the buried insulating patterns 132 may be processed by anisotropic etching. The interlayer insulating layer 122 and the buried insulating patterns 132 may be processed by plasma dry etching. The interlayer insulating layer 122 and the buried insulating patterns 132 may be etched with a high selectivity with respect to the monocrystalline semiconductor patterns 121. Here, that the interlayer insulating layer 122 and the buried insulating patterns 132 may be etched with a high selectivity with respect to the monocrystalline semiconductor patterns 121 means that the etching amount of the interlayer insulating layer 122 and the buried insulating patterns 132 is greater than that of the monocrystalline semiconductor patterns 121 during the etching process.

According to example embodiments, in the etching process of operation P80, the etch selectivity of the monocrystalline semiconductor patterns 121 to the interlayer insulating layer 122 and the buried insulating patterns 132 may be 1:1.1 or higher. According to example embodiments, the etch selectivity of the monocrystalline semiconductor patterns 121 to the interlayer insulating layer 122 and the buried insulating patterns 132 may be 1:20 or lower.

According to example embodiments, plasma etching parameters of the interlayer insulating layer 122 and the buried insulating patterns 132 may be determined such that the interlayer insulating layer 122 and the buried insulating patterns 132 show a high etch selectivity over the monocrystalline semiconductor patterns 121. The plasma etching parameters may include the process and partial pressure thereof, chamber pressure, bias power, source power, and the like.

For example, the top surface of the monocrystalline semiconductor pattern 121 may be an end point of the etching process of operation P80. For example, when a particle formed by etching the monocrystalline semiconductor pattern 121 is sensed, the etching process of operation P80 may be terminated. However, embodiments are not limited thereto, e.g., the etching process of operation P80 may be terminated after a certain time elapses.

Subsequently, referring to FIGS. 3 and 11A to 12B, the uppermost monocrystalline semiconductor pattern 121 may be etched in operation P90. According to example embodiments, an exposed portion (i.e., a portion that is not covered with the stopper pattern 133) of the uppermost monocrystalline semiconductor pattern 121 may be etched. When the uppermost monocrystalline semiconductor pattern 121 is etched, the top surface of the interlayer insulating layer 122 may be exposed.

The uppermost monocrystalline semiconductor pattern 121 may be processed by anisotropic etching. The uppermost monocrystalline semiconductor pattern 121 may be processed by plasma dry etching. The uppermost monocrystalline semiconductor pattern 121 may be etched with a high selectivity with respect to the interlayer insulating layer 122 and the buried insulating patterns 132.

According to example embodiments, the etching process of operation P90 may have a reverse etch selectivity, compared with the etching process of operation P80. According to example embodiments, in the etching process of operation P90, the etch selectivity of the interlayer insulating layer 122 and the buried insulating patterns 132 to the monocrystalline semiconductor pattern 121 may be 1:1.1 or higher. According to example embodiments, the etch selectivity of the interlayer insulating layer 122 and the buried insulating patterns 132 to the monocrystalline semiconductor pattern 121 may be 1:20 or lower.

According to example embodiments, plasma etching parameters of the monocrystalline semiconductor patterns 121 may be determined such that the monocrystalline semiconductor patterns 121 show a high etch selectivity over the interlayer insulating layer 122 and the buried insulating patterns 132. According to example embodiments, process gas, partial pressure thereof, chamber pressure, bias power, and source power used in operation P90 may be different from those used in operation P80.

Subsequently, referring to FIGS. 3 and 12A to 13B, the interlayer insulating layer 122 and the buried insulating patterns 132 may be partially etched in operation P100. The stopper patterns 133 may be etched together with the interlayer insulating layer 122 and the buried insulating patterns 132. The etching of operation P100 may be performed to expose the top surface of the second uppermost monocrystalline semiconductor pattern 121. The etching of operation P100 is similar to the etching of operation P80, and thus, redundant descriptions thereof are omitted.

Subsequently, referring to FIGS. 3 and 13A to 14B, the second uppermost monocrystalline semiconductor pattern 121 may be etched in operation P110. An exposed portion (i.e., a portion that is not covered with the interlayer insulating layer 122) of the second uppermost monocrystalline semiconductor pattern 121 may be etched. The etching of operation P110 may be performed to expose the top surface of the interlayer insulating layer 122. The etching of operation P110 is similar to the etching of operation P90, and thus, redundant descriptions thereof are omitted.

A series of the etching processes described with reference to operations P80 to P110 may be repeatedly performed. Accordingly, the first and second step structures ST1 and ST2 (see FIG. 2A) may be formed in the contact region CNTR (see FIG. 2A).

In the series of the etching processes described with reference to operations P80 to P110, e.g., a portion including alternating monocrystalline silicon and silicon oxide and a portion including only silicon oxide, are simultaneously etched. If the monocrystalline semiconductor patterns 121, the interlayer insulating layer 122, and the buried insulating patterns 132 were to be etched by repeating the same etching processes, etch uniformity would have decreased. In detail, an etch profile would have been distorted at the boundary between the portion including alternating monocrystalline silicon and silicon oxide and the portion including only silicon oxide.

In contrast, according to example embodiments, the parameters of a process of mainly etching the monocrystalline semiconductor pattern 121 are different from those of a process of mainly etching the interlayer insulating layer 122 and the buried insulating patterns 132. Accordingly, the reliability of etching may be increased.

Subsequently, referring to FIGS. 3 and 14A to 15B, the interlayer insulating layer 122 and the buried insulating patterns 132 may be partially etched in operation P120. When the etching is performed in operation P120, the top surface of each of a plurality of monocrystalline semiconductor patterns 121, except for the uppermost monocrystalline semiconductor pattern 121, may be exposed. The etching of operation P120 is similar to the etching of operation P80, and thus, redundant descriptions thereof are omitted. When the etching is performed in operation P120, the interlayer insulating layer 122 may be recessed in the X direction with respect to the monocrystalline semiconductor patterns 121.

Subsequently, referring to FIGS. 3 and 15A to 16B, a selective growth pattern 123 may be formed on the top surface of each of the monocrystalline semiconductor patterns 121 in operation P130. According to example embodiments, the selective growth pattern 123 may be formed only on the top surface of each of the monocrystalline semiconductor patterns 121. For example, the selective growth pattern 123 may not be formed on any one of the interlayer insulating layer 122, the buried insulating patterns 132, and the stopper patterns 133. Accordingly, the selective growth pattern 123 may be separated from the interlayer insulating layer 122, the buried insulating patterns 132, and the stopper patterns 133.

According to some embodiments, the selective growth pattern 123 may be formed by epitaxial growth using a corresponding one of the monocrystalline semiconductor patterns 121 as a seed layer. According to some embodiments, the selective growth pattern 123 may be formed by deposition, e.g., CVD. When the selective growth pattern 123 is formed by deposition, e.g., CVD, a mask or the like may be used to limit the deposited position of the selective growth pattern 123. According to example embodiments, when the selective growth pattern 123 is formed by deposition, e.g., CVD, an annealing process may be further performed.

Subsequently, referring to FIGS. 3 and 16A to 17B, the contact electrodes 124 and the uppermost contact electrode 124U may be formed in operation P140. The contact electrodes 124 and the uppermost contact electrode 124U may be formed by removing the selective growth patterns 123 and the monocrystalline semiconductor patterns 121, and providing a conductive material to spaces obtained by removing the selective growth patterns 123 and the monocrystalline semiconductor patterns 121.

Subsequently, referring to FIGS. 2C, 2D, and 3, the upper insulating layer 135 and the conductive contacts 140 may be formed in operation P150.

By way of summation and review, embodiments provide a semiconductor memory device having increased reliability and integration density and a method of manufacturing the same. That is, according to example embodiments, the first landing portion 124UB of the uppermost contact electrode 124U and the second landing portion 124B of the contact electrode 124 have an increased thickness, thereby preventing defects from occurring due to an over-etch during an etching process performed to form the conductive contacts 140.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a substrate including a cell array region and a contact region;
   contact electrodes in the contact region, the contact electrodes extending in a first direction that is parallel with a top surface of the substrate, each of the contact electrodes including a connection portion having a first thickness and a landing portion having a second thickness;
   an uppermost contact electrode above the contact electrodes, the contact electrodes being longer in the first direction than the uppermost contact electrode and defining a step structure;
   transistor bodies in the cell array region, each of the transistor bodies extending in a second direction that is parallel with the top surface of the substrate and perpendicular to the first direction, each of the transistor bodies including a first source/drain region, a monocrystalline channel layer, and a second source/drain region sequentially arranged in the second direction, and the monocrystalline channel layer of each of the transistor bodies being connected to a corresponding one of the contact electrodes;
   a lower electrode layer in the cell array region, the lower electrode layer being connected to the second source/drain region of each of the transistor bodies;
   a capacitor dielectric layer in the cell array region, the capacitor dielectric layer covering the lower electrode layer and having a uniform thickness; and
   an upper electrode layer in the cell array region, the upper electrode layer being separated from the lower electrode layer by the capacitor dielectric layer therebetween.

2. The semiconductor memory device as claimed in claim 1, wherein the second thickness is greater than the first thickness.

3. The semiconductor memory device as claimed in claim 1, wherein a difference between the second thickness and the first thickness is about 30 nm or less.

4. The semiconductor memory device as claimed in claim 1, further comprising conductive contacts in the contact region, each of the conductive contacts extending in a third direction perpendicular to the top surface of the substrate, and each of the conductive contacts being connected to the landing portion of a respective one of the contact electrodes.

5. The semiconductor memory device as claimed in claim 1, wherein the landing portion of each of the contact electrodes is connected to the monocrystalline channel layer through the connection portion thereof.

6. The semiconductor memory device as claimed in claim 1, wherein the landing portion of each of the contact electrodes overlaps with the connection portion of a lower one of the contact electrodes in a third direction that is perpendicular to the top surface of the substrate.

7. The semiconductor memory device as claimed in claim 1, wherein the landing portion of each of the contact electrodes is separated from the landing portion of a lower one of the contact electrodes in the first direction.

8. The semiconductor memory device as claimed in claim 1, wherein:
   the uppermost contact electrode is farther from the substrate than the contact electrodes are, and
   a length in the first direction of a landing portion of the uppermost contact electrode is different from a length in the first direction of the landing portion of each of the contact electrodes.

9. The semiconductor memory device as claimed in claim 8, wherein the length in the first direction of the landing portion of the uppermost contact electrode is greater than the length in the first direction of the landing portion of each of the contact electrodes.

10. A semiconductor memory device, comprising:
    a substrate including a cell array region and a contact region;
    memory cells in the cell array region, each of the memory cells being arranged in a third direction that is perpendicular to a top surface of the substrate and including a cell transistor and a cell capacitor;
    a first step structure in the contact region, the first step structure extending in a first direction that is parallel with the top surface of the substrate;
    a second step structure in the contact region, the second step structure extending in the first direction and being separated from the first step structure in a second direction that is perpendicular to the first direction and parallel with the top surface of the substrate; and
    an interlayer insulating layer between the first step structure and the second step structure,
    wherein each of the first step structure and the second step structure includes contact electrodes and an uppermost contact electrode on the contact electrodes, the contact electrodes being stacked on the substrate in the third direction,
    wherein the uppermost contact electrode includes a first connection portion having a first thickness and a first landing portion having a second thickness,
    wherein each of the contact electrodes includes a second connection portion having the first thickness and a second landing portion having the second thickness, and
    wherein a length in the first direction of the first landing portion is different from a length in the first direction of the second landing portion.

11. The semiconductor memory device as claimed in claim 10, wherein the length in the first direction of the first landing portion is greater than the length in the first direction of the second landing portion.

12. The semiconductor memory device as claimed in claim 10, wherein the second thickness is greater than the first thickness.

13. The semiconductor memory device as claimed in claim 10, wherein a difference between the second thickness and the first thickness is about 30 nm or less.

14. The semiconductor memory device as claimed in claim 10, further comprising conductive contacts, each of the conductive contacts extending in the third direction and being connected to the second landing portion of a respective one of the contact electrodes.

\* \* \* \* \*